United States Patent
Tokuhara et al.

(10) Patent No.: US 11,317,043 B2
(45) Date of Patent: Apr. 26, 2022

(54) IMAGING DEVICE

(71) Applicant: Panasonic Intellectual Property Management Co., Ltd., Osaka (JP)

(72) Inventors: Takeyoshi Tokuhara, Osaka (JP); Yasuo Miyake, Osaka (JP); Sanshiro Shishido, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 141 days.

(21) Appl. No.: 16/906,446

(22) Filed: Jun. 19, 2020

(65) Prior Publication Data
US 2020/0322556 A1    Oct. 8, 2020

Related U.S. Application Data

(63) Continuation of application No. PCT/JP2018/044808, filed on Dec. 6, 2018.

(30) Foreign Application Priority Data

Dec. 28, 2017    (JP) .............................. JP2017-253343

(51) Int. Cl.
*H04N 5/374* (2011.01)
*H01L 27/30* (2006.01)

(52) U.S. Cl.
CPC .......... *H04N 5/374* (2013.01); *H01L 27/307* (2013.01)

(58) Field of Classification Search
CPC .... H04N 5/374; H04N 5/3575; H04N 5/3698; H04N 5/3745; H01L 27/307;
(Continued)

(56) References Cited

U.S. PATENT DOCUMENTS

2016/0035920 A1    2/2016 Tashiro et al.
2016/0105622 A1*   4/2016 Tamaki .............. H04N 5/35563
                                                          348/322
(Continued)

FOREIGN PATENT DOCUMENTS

JP    2009-212618    9/2009
JP    2009-284358    12/2009
(Continued)

OTHER PUBLICATIONS

International Search Report of PCT application No. PCT/JP2018/044808 dated Mar. 5, 2019.

*Primary Examiner* — Sinh Tran
*Assistant Examiner* — Zhenzhen Wu
(74) *Attorney, Agent, or Firm* — McDermott Will & Emery LLP

(57) ABSTRACT

An imaging device includes a pixel including a permittivity modulation element that includes opposite and pixel electrodes and a permittivity modulation structure whose permittivity changes according to the radiation of light, a capacitive element that includes first and second electrodes, and a detection circuit that outputs a signal corresponding to the potential of the pixel electrode. Also provided are a voltage supply circuit that applies first and second voltages in different first and second periods to one of the opposite electrode and the first electrode, and a signal processing circuit that generates a third signal being a difference between a first signal output from the detection circuit in the first period and a second signal output from the detection circuit in the second period. The potential difference between the opposite electrode and the first electrode when the second voltage is applied is less than when the first voltage is applied.

20 Claims, 13 Drawing Sheets

(58) Field of Classification Search
CPC ......... H01L 27/14609; H01L 27/14621; H01L 27/14627; H01L 27/14636; H01L 27/14665; H01L 31/10; H01L 51/42; Y02E 10/549
See application file for complete search history.

(56) References Cited

U.S. PATENT DOCUMENTS

| | | | |
|---|---|---|---|
| 2017/0328776 A1 | 11/2017 | Shimasaki et al. | |
| 2017/0331062 A1 | 11/2017 | Tamaki | |
| 2018/0151608 A1* | 5/2018 | Tashiro | H04N 5/353 |
| 2018/0219047 A1 | 8/2018 | Tokuhara et al. | |
| 2018/0249104 A1* | 8/2018 | Sasago | H01L 27/14645 |
| 2020/0221042 A1* | 7/2020 | Watanabe | H01L 27/146 |

FOREIGN PATENT DOCUMENTS

| | | |
|---|---|---|
| JP | 2011-060830 | 3/2011 |
| JP | 2014-216754 | 11/2014 |
| JP | 2016-033983 | 3/2016 |
| JP | 2016-076921 | 5/2016 |
| JP | 2017-216459 | 12/2017 |
| WO | 2017/081831 | 5/2017 |
| WO | 2017/081844 | 5/2017 |
| WO | 2017/081847 | 5/2017 |

* cited by examiner

IMAGING DEVICE

BACKGROUND

1. Technical Field

The present disclosure relates to an imaging device.

2. Description of the Related Art

In the related art, photodetection elements are used in devices such as photodetectors and image sensors. Typical examples of photodetection elements are photoelectric transducers such as photodiodes and phototransistors. As is well known, by detecting a photocurrent generated in a photoelectric converter by irradiation of light, the light can be detected.

SUMMARY

FIG. 2 of Japanese Unexamined Patent Application Publication No. 2011-60830 discloses a thin-film transistor (TFT) having an organic film in which a predetermined compound is dispersed in an organic polymer as a gate-insulating film. For the predetermined compound contained in the organic film, a compound whose polarization state changes depending on the radiation of light is selected. With the thin-film transistor of Japanese Unexamined Patent Application Publication No. 2011-60830, when the gate-insulating film is irradiated with light, the permittivity of the gate-insulating film changes. For this reason, the current flowing between the source and the drain changes depending on the radiation of light onto the gate-insulating film. Japanese Unexamined Patent Application Publication No. 2011-60830 states that such a thin-film transistor is usable in a light sensor.

International Publication Nos. WO 2017/081847 and WO 2017/081831 disclose apparatus capable of detecting light through a change in the capacitance between two electrodes sandwiching a photoelectric conversion layer or a change in the permittivity of a photoelectric conversion layer, the change being caused by the radiation of light. The entirety of the content disclosed in International Publication Nos. WO 2017/081847 and WO 2017/081831 is hereby incorporated by reference.

One non-limiting and exemplary embodiment provides an imaging device with a novel configuration.

In one general aspect, the techniques disclosed here feature an imaging device comprising one or more pixels, each of the one or more pixels including a permittivity modulation element that includes an opposite electrode, a pixel electrode, and a permittivity modulation structure between the opposite electrode and the pixel electrode, a permittivity of the permittivity modulation structure being configured to change according to a radiation of light, a capacitive element that includes a first electrode and a second electrode, the second electrode being electrically connected to the pixel electrode, and a detection circuit that outputs a signal corresponding to a potential of the pixel electrode; a voltage supply circuit that applies a first voltage in a first period and a second voltage in a second period different from the first period to one of the opposite electrode and the first electrode; and a signal processing circuit that generates a third signal, the third signal being a difference between a first signal output from the detection circuit in the first period and a second signal output from the detection circuit in the second period, wherein a potential difference between the opposite electrode and the first electrode when the second voltage is applied to the one is less than a potential difference between the opposite electrode and the first electrode when the first voltage is applied to the one.

According to an aspect of the present disclosure, an imaging device with a novel configuration is provided.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
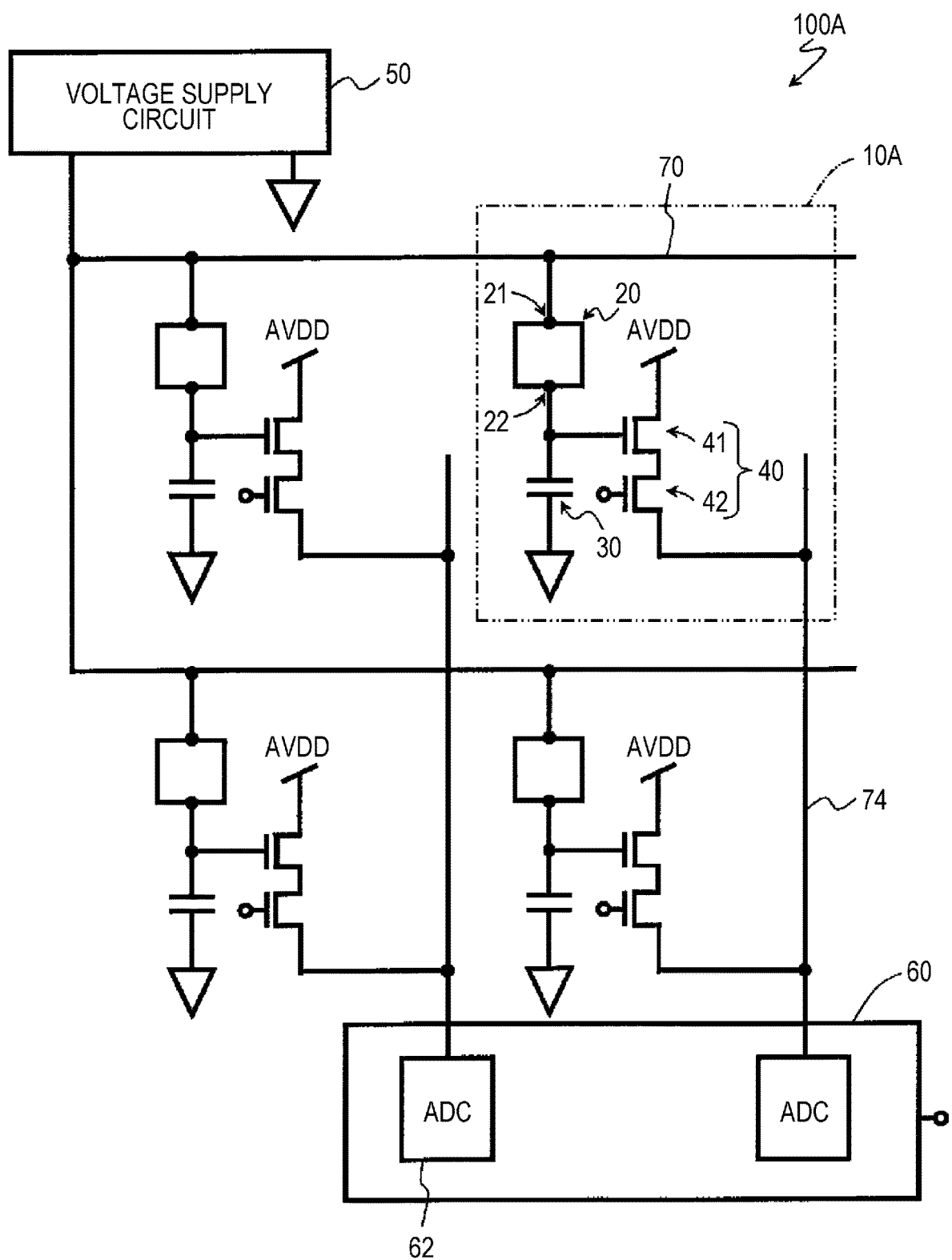
FIG. 1 is a diagram schematically illustrating a configuration of an imaging device according to a first embodiment of the present disclosure.

An overview of aspects of the present disclosure is given below.

Item 1

An imaging device provided with one or more pixels, each of the one or more pixels including
- a permittivity modulation element that includes a first terminal, a second terminal, and a permittivity modulation structure between the first terminal and the second terminal, a permittivity of the permittivity modulation structure being configured to change according to a radiation of light,
- a capacitive element that includes a first electrode and a second electrode, the second electrode being electrically connected to the second terminal of the permittivity modulation element, and
- a detection circuit that outputs a signal corresponding to a potential of the second terminal, the imaging device further comprising:
- a voltage supply circuit that applies a first voltage in a first period and a second voltage in a second period different from the first period to one of the first terminal of the permittivity modulation element and the first electrode of the capacitive element; and
- a signal processing circuit that generates a third signal, the third signal being a difference between a first signal output from the detection circuit in the first period and a second signal output from the detection circuit in the second period, wherein a potential difference between the first terminal and the first electrode when the second voltage is applied to the one is less than a potential difference between the first terminal and the first electrode when the first voltage is applied to the one.

According to the configuration of Item 1, light can be detected through a change in the permittivity of the permittivity modulation element due to the radiation of light. For example, the voltage supply circuit supplies the high-level first voltage to each pixel in an exposure period for example, and supplies the low-level second voltage to each pixel in a reference level readout period. The signal processing circuit generates the difference between the signal acquired in the first period during which the first voltage is supplied and the signal acquired in the second period during which the second voltage is supplied. With this arrangement, the noise component is reduced and the SN ratio is secured.

Item 2

The imaging device according to Item 1, wherein the signal processing circuit outputs a fifth signal obtained by subtracting a fourth signal corresponding to an offset level from the third signal.

According to the configuration of Item 2, the effective change in the voltage level corresponding to the change in the permittivity due to the radiation of light can be acquired, regardless of the amount of charge stored in a node between a second terminal of the permittivity modulation element and a second electrode of the capacitive element in an initial state. Therefore, it is possible to reduce fixed-pattern noise arising from inconsistencies in the offset level for each pixel.

Item 3

The imaging device according to Item 2, wherein the fourth signal is a signal output from the detection circuit in a state in which the first voltage is applied to the one of the first terminal and the first electrode, and the permittivity modulation structure is not irradiated with light.

According to the configuration of Item 3, a signal corresponding to the offset level can be acquired as the fourth signal.

Item 4

The imaging device according to Item 3, wherein
the one or more pixels are a plurality of pixels,
the plurality of pixels includes a dummy pixel further including a light shielding layer that covers the permittivity modulation structure, and
the fourth signal is a signal output from the detection circuit of the dummy pixel in a state in which the first voltage is applied to the one of the first terminal and the first electrode.

According to the configuration of Item 4, because the output of the detection circuit of the dummy pixel can be utilized as the fourth signal, a signal corresponding to the offset level can be acquired with a relatively simple configuration.

Item 5

The imaging device according to Item 3, further comprising:
a mechanical shutter that switches between allowing light to be incident on the permittivity modulation structure and shielding the permittivity modulation structure from light, wherein
the first signal is a signal output from the detection circuit in a state in which the mechanical shutter is open, and
the fourth signal is a signal output from the detection circuit in a state in which the first voltage is applied to the one of the first terminal and the first electrode, and the mechanical shutter is closed.

According to the configuration of Item 5, the first voltage is applied to one of the first terminal and the first electrode, and additionally, the signal output from the detection circuit in the state while the mechanical shutter is closed expresses a signal corresponding to the offset level. Therefore, even if the offset level is different for every pixel, it is possible to compute the offset accurately.

Item 6

The imaging device according to Item 2, wherein the fourth signal is a signal output from the detection circuit immediately after the voltage applied to the one of the first terminal and the first electrode is switched from the second voltage to the first voltage.

According to the configuration of Item 6, because the signal output from the detection circuit at the beginning of the first period is acquired as a signal corresponding to the offset level, it is possible to acquire a signal corresponding to the offset level without providing a special structure.

Item 7

The imaging device according to Item 2, further comprising:
a light source, wherein
the light source radiates light of a predetermined wavelength band on an object in the first period, and
the fourth signal is a signal output from the detection circuit in a state in which the first voltage is applied to the one of the first terminal and the first electrode, and the light source is in an unlighted state.

According to the configuration of Item 7, the object is irradiated with light in a wavelength range of weak intensity included in ambient light, and by detecting the light in the wavelength range, it is possible to compute an accurate offset level corresponding to each pixel.

Item 8

The imaging device according to any one of Items 1 to 7, wherein
in two or more consecutive frame periods, a number of times that the second signal is read out by the detection circuit is less than a number of times that the first signal is read out by the detection circuit.

According to the configuration of Item 8, because the acquisition of the second signal in every frame period is omitted, the period taken for signal readout is shortened, and imaging may be executed at high speed. Alternatively, it is possible to extend the exposure time and achieve a higher SN ratio.

Item 9

The imaging device according to any one of Items 1 to 8, wherein
the first terminal and the second terminal are a pair of a pixel electrode and an opposite electrode having transparency that sandwich the permittivity modulation structure, and
the permittivity modulation structure includes
a photoelectric conversion layer, and
a charge-blocking layer located between either the pixel electrode or the opposite electrode and the photoelectric conversion layer.

According to the configuration of Item 9, the movement of charge between the photoelectric conversion layer and the pixel electrode as well as the opposite electrode can be suppressed. For this reason, the charge produced by photoelectric conversion can be kept in the photoelectric conversion layer and the charge density at the electrodes can be increased, thereby making it possible to detect light through changes in the permittivity of the permittivity modulation structure.

Item 10

The imaging device according to Item 9, wherein the photoelectric conversion layer contains an organic material.

Item 11

The imaging device according to any one of Items 1 to 8, wherein
the first terminal and the second terminal are a pair of a pixel electrode and an opposite electrode having transparency that sandwich the permittivity modulation structure, and
the permittivity modulation structure includes
a layer containing a quantum dot that produces charge pairs in response to a radiation of light, and
a charge-blocking layer located between either the pixel electrode or the opposite electrode and the layer containing the quantum dot.

According to the configuration of Item 11, the movement of charge between the layer containing a quantum dot and the pixel electrode as well as the opposite electrode can be suppressed. Consequently, effects similar to the configuration of Item 9 can be obtained.

Item 12

The imaging device according to any one of Items 1 to 8, wherein
the first terminal and the second terminal are a pair of a pixel electrode and an opposite electrode having transparency that sandwich the permittivity modulation structure, and
the permittivity modulation structure includes a layer containing a material whose permittivity changes due to a radiation of light.

According to the configuration of Item 12, like the case of applying the permittivity modulation element including a photoelectric conversion layer, light can be detected through a change in the permittivity of the permittivity modulation element due to the radiation of light.

Item 13

The imaging device according to Item 9 or 10, wherein
the permittivity modulation structure includes
a first charge-blocking layer located between the opposite electrode and the photoelectric conversion layer, and
a second charge-blocking layer located between the pixel electrode and the photoelectric conversion layer.

According to the configuration of Item 13, the movement of charge between the photoelectric conversion layer and the electrode may be suppressed more reliably.

Item 14

The imaging device according to Item 11, wherein
the permittivity modulation structure includes
a first charge-blocking layer located between the opposite electrode and the layer containing the quantum dot, and
a second charge-blocking layer located between the pixel electrode and the layer containing the quantum dot.

According to the configuration of Item 14, the movement of charge between the layer containing a quantum dot and the electrode may be suppressed more reliably.

Item 15

The imaging device according to Item 13 or 14, wherein the first charge-blocking layer and the second charge-blocking layer are insulating layers.

Item 16

The imaging device according to any one of Items 9 to 15, wherein
  each of the one or more pixels includes a reset transistor, one of a source and a drain of the reset transistor being electrically connected to the pixel electrode, and
  the reset transistor supplies a reset voltage that resets the potential of the pixel electrode to the pixel electrode in the second period.

According to the configuration of Item 16, by turning on the reset transistor, the potential of the pixel electrode of each pixel can be made to agree with the reset voltage, thereby reducing inconsistencies in the reference level of every pixel.

Item 17

The imaging device according to Item 16, wherein the detection circuit reads out the second signal after the reset transistor resets the potential of the pixel electrode.

Item 18

The imaging device according to Item 16 or 17, wherein
  the voltage supply circuit applies the second voltage to the first terminal of the permittivity modulation element in the second period, and
  the reset voltage is equal to the second voltage.

According to the configuration of Item 18, it is possible to set the potential difference imposed on the permittivity modulation structure after a reset operation to substantially 0 V, thereby making it possible to set the sensitivity of a specific pixel to zero at any timing, for example.

Item 19

The imaging device according to any one of Items 1 to 18, further comprising:
  a first substrate supporting the permittivity modulation element, the detection circuit of each of the one or more pixels being located on the first substrate; and
  a second substrate different from the first substrate, the signal processing circuit being located on the second substrate.

Item 20

The imaging device according to any one of Items 1 to 19, wherein the first period and the second period are included in a same single frame period.

Hereinafter, embodiments of the present disclosure will be described in detail and with reference to the drawings. Note that the embodiments described hereinafter all illustrate general or specific examples. Features such as numerical values, shapes, materials, structural elements, arrangements and connection states of structural elements, steps, and the ordering of steps indicated in the following embodiments are merely examples, and are not intended to limit the present disclosure. The various aspects described in this specification may also be combined with each other in non-contradictory ways. In addition, among the structural elements in the following embodiments, structural elements that are not described in the independent claim indicating the broadest concept are described as arbitrary or optional structural elements. In the following description, structural elements having substantially the same functions will be denoted by shared reference signs, and the description of such structural elements may be reduced or omitted.

FIRST EMBODIMENT

FIG. 1 is a diagram schematically illustrating a configuration of an imaging device according to a first embodiment of the present disclosure. An imaging device 100A includes a plurality of pixels 10A, a voltage supply circuit 50 electrically connected to the pixels 10A, and a signal processing circuit 60 that receives the output from the pixels 10A. By arranging the pixels 10A into a two-dimensional matrix for example, an imaging region is formed. Herein, the for the sake of simplicity, four of the plurality of pixels 10A included in the imaging device 100A are picked out and illustrated. In the example illustrated in FIG. 1, the four pixels 10A are arranged in a 2-row, 2-column matrix. Note that the number and arrangement of the pixels 10A in the imaging device 100A may be any number and any arrangement, and there may also be a single pixel 10A. Also, in the case where the pixels 10A have a one-dimensional arrangement, for example, the imaging device 100A may be made to function as a line sensor.

As illustrated schematically in FIG. 1, each pixel 10A generally includes a permittivity modulation element 20, a capacitive element 30, and a detection circuit 40. The permittivity modulation element 20 is an element that partially includes a permittivity modulation structure that has a property of the permittivity changing due to the radiation of light, and includes a first terminal 21 and a second terminal 22. The permittivity modulation element 20 is irradiated with light and changes the capacitance value between the first terminal 21 and the second terminal 22, for example. An example of the configuration of the permittivity modulation element 20 will be described later.

As illustrated in the diagram, one electrode of the capacitive element 30 is electrically connected to the second terminal 22. In the configuration exemplified in FIG. 1, the potential of the other electrode of the capacitive element 30 is fixed to ground. The concrete configuration of the capacitive element 30 is not limited to a specific configuration. The capacitive element 30 may be configured as a composite capacitor of a plurality of capacitive elements, or as a composite capacitor obtained by connecting one or more capacitive elements and parasitic capacitances, such as wires or interconnects, in parallel or in series. The capacitive element 30 may be designed to have a capacitance value substantially equal to or greater than the permittivity modulation element 20 when compared to a dark state when light is not incident on the pixel 10A.

The detection circuit 40 is electrically connected to the second terminal 22 and outputs a signal corresponding to the potential of the second terminal 22. In this example, the detection circuit 40 includes a signal detection transistor 41 and an address transistor 42. Typically, the signal detection transistor 41 and the address transistor 42 are field-effect transistors (FETs). Hereinafter, n-channel MOSFETs are illustrated as an example of the signal detection transistor 41 and the address transistor 42.

As illustrated in the diagram, the gate of the signal detection transistor 41 is connected to the second terminal 22. During operation, supplying a power supply voltage for example to the drain causes the signal detection transistor 41 to operate as a source follower. According to such a configuration, the potential of the second terminal 22 is not changed by a readout of the signal from the pixel 10A. In other words, the signal can be read out non-destructively.

The source of the signal detection transistor 41 is connected to an output signal line 74 via the address transistor 42. The turning on and off of the address transistor 42 may be controlled by a row scanning circuit not illustrated via an address signal line provided for every row of the plurality of pixels 10A, for example. By controlling the address transistors 42 in units of rows or units of columns, a signal can be read out from a pixel 10A among the plurality of pixels 10A at an arbitrarily decided timing.

The output signal line 74 is provided for every column of the plurality of pixels 10A, and is connected to the signal processing circuit 60. The signal processing circuit 60 processes output signals read out from the pixels 10A, such as by performing noise suppression signal processing as typified by correlated double sampling, and analog-to-digital conversion. In this example, the signal processing circuit 60 includes a plurality of analog-to-digital conversion circuits 62 (hereinafter simply referred to as "AD conversion circuits 62"). As illustrated in the diagram, one of the AD conversion circuits 62 is provided for every output signal line 74. In other words, each AD conversion circuit 62 is connected to a corresponding output signal line 74.

The output of the signal processing circuit 60 is read out to equipment external to the imaging device 100A via an output circuit for example. Note that the AD conversion circuits 62 may also be disposed per row or per column of the plurality of pixels 10A, and may also be disposed per pixel 10A.

In the configuration exemplified in FIG. 1, the voltage supply circuit 50 is connected to the first terminal 21 of the permittivity modulation element 20 of each pixel 10A via a power line 70. During operation, the voltage supply circuit 50 supplies a predetermined voltage to each pixel 10A. The voltage supply circuit 50 has a configuration capable of switching between at least two different voltages to supply to each pixel 10A. As described in detail later, the voltage supply circuit 50 applies a first voltage to the permittivity modulation element 20 in a first period, and supplies a second voltage different from the first voltage to the permittivity modulation element 20 in a second period different from the first period. The voltage supply circuit 50 is not limited to a specific power source circuit, and may be a circuit that generates a predetermined voltage, or a circuit that converts a voltage supplied from another power source to a predetermined voltage.

Device Structure of Pixel

Figure 2:
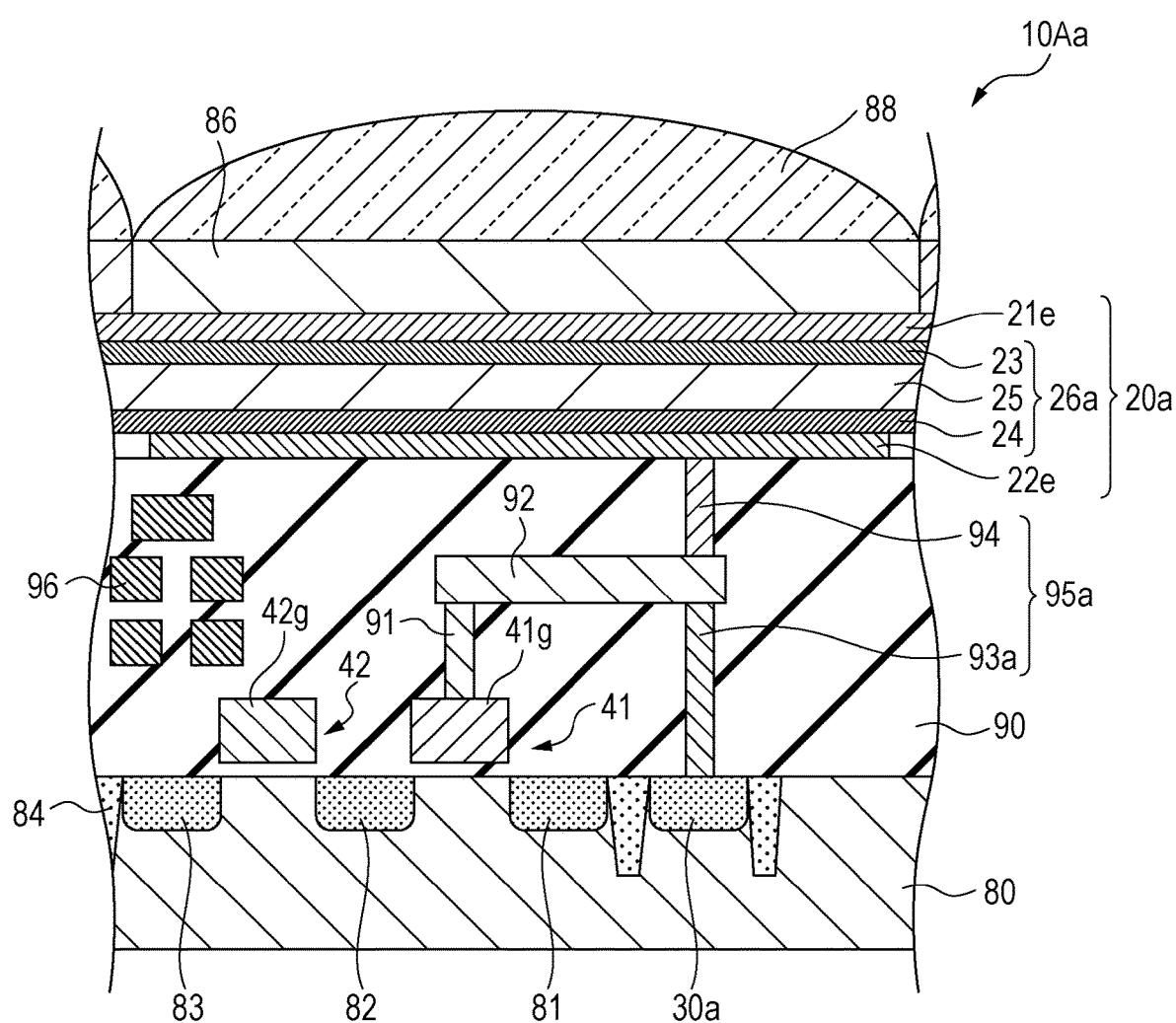
FIG. 2 is a schematic cross-sectional view illustrating an exemplary device structure of a pixel.

FIG. 2 schematically illustrates an exemplary device structure of a pixel included in the imaging device of the present disclosure. A pixel 10Aa illustrated in FIG. 2 is one example of the pixel 10A described above. Note that FIG. 2 is merely a schematic illustration of the layout of components included in the pixel 10A, and the dimensions of each component illustrated in FIG. 2 do not necessarily reflect the dimensions of an actual device. The same applies to the other diagrams of the present disclosure.

The pixel 10Aa illustrated in FIG. 2 generally includes a semiconductor substrate 80, an insulating layer 90 that covers the semiconductor substrate 80, and a permittivity modulation element 20a supported on the insulating layer 90. Typically, the insulating layer 90 contains two or more insulating layers formed from silicon dioxide. The permittivity modulation element 20a is one example of the permittivity modulation element 20 described above. As illustrated in the diagram, an optical filter 86 such as a color filter, a microlens 88, and the like may be disposed on top of the permittivity modulation element 20a.

In the configuration exemplified in FIG. 2, the permittivity modulation element 20a includes a pixel electrode 22e supported on the insulating layer 90, an opposite electrode 21e positioned farther away from the semiconductor substrate 80 than the pixel electrode 22e, and a permittivity modulation structure 26a positioned between the pixel electrode 22e and the opposite electrode 21e. Herein, the opposite electrode 21e corresponds to the first terminal 21 of the permittivity modulation element 20 described above, while the pixel electrode 22e corresponds to the second terminal 22.

By spatially separating the pixel electrode 22e from other adjacent pixels 10Aa, the pixel electrode 22e is electrically isolated from the pixel electrodes 22e of the other adjacent pixels 10Aa. The material used for the pixel electrode 22e may be a conductive material that is stable and highly opaque, such as TiN or TaN, for example.

On the other hand, the opposite electrode 21e is formed from a conductive material having transparency such as ITO for example. Note that the term "transparency" in this specification means that at least part of the light in the wavelength range to be detected is transmitted, and it is not necessary to transmit light over the entire wavelength range of visible light. The light detected by the imaging device of the present disclosure is not limited to light in the visible wavelength range, that is, light having a wavelength from 380 nm or greater to 780 nm or less. In this specification, the entire electromagnetic spectrum, including infrared rays and ultraviolet rays, are designated "light" for the sake of convenience.

Typically, the opposite electrode 21e is formed as a single electrode continuous over a plurality of the pixels 10Aa. Consequently, by connecting the opposite electrode 21e to the power line 70, a desired voltage can be applied all at once to the opposite electrodes 21e of a plurality of the pixels 10Aa through the power line 70. Obviously, it is not necessary for the opposite electrode 21e to be continuous across all of the pixels 10Aa. For example, the opposite electrode 21e may also be isolated on every row or every column across a plurality of the pixels 10Aa.

Light transmitted through the opposite electrode 21e is incident on the permittivity modulation structure 26a. The permittivity modulation structure 26a changes permittivity in response to being irradiated by the light. By causing light to be incident on the permittivity modulation structure 26a while in a state in which a predetermined potential difference is established between the pixel electrode 22e and the opposite electrode 21e, the light can be detected through the change in the permittivity of the permittivity modulation structure 26a. Details about the configuration of the permittivity modulation structure 26a and details about the light detection mechanism utilizing a change of permittivity in the permittivity modulation structure 26a will be described later.

In this example, the pixel electrode 22e is electrically connected to an impurity region 30a formed in the semiconductor substrate 80 through a connecting part 95a disposed in the insulating layer 90. Herein, a p-type silicon substrate is illustrated as an example of the semiconductor substrate 80. The impurity region 30a is an n-type diffusion region, for example. The junction capacitance formed by a pn junction including the impurity region 30a may function as the capacitive element 30 described above. The semiconductor substrate 80 is not limited to a substrate that is entirely a semiconductor, and may also be an insulating substrate or the like provided with a semiconductor layer at the surface on the side where the permittivity modulation element 20a is disposed.

As illustrated in the diagram, the signal detection transistor 41 and the address transistor 42 additionally may be formed on the semiconductor substrate 80. A plug 91 is connected to a gate electrode 41g of the signal detection transistor 41. The plug 91 is connected through an interconnect 92 to a plug 93a that is connected to the impurity region 30a described above. In other words, the connecting part 95a also includes a connection to the gate electrode 41g of the signal detection transistor 41. Typically, the plug 91 and the plug 93a are polysilicon plugs. The interconnect 92 is a polysilicon interconnect for example, and a plug 94 connecting the interconnect 92 and the pixel electrode 22e to each other is a metal plug formed from copper or the like.

The semiconductor substrate 80 additionally includes impurity regions 81, 82, and 83, as well as an isolation region 84. The impurity region 81 functions as a drain region of the signal detection transistor 41, and the impurity region 82 functions as a source region of the signal detection transistor 41. In this example, the address transistor 42 shares the impurity region 82 with the signal detection transistor 41, and the impurity region 82 also functions as a drain region of the address transistor 42. The impurity region 83 functions as a source region of the address transistor 42. The output signal line 74 described above is connected to the impurity region 83. The output signal line 74 is omitted from illustration in FIG. 2. An address signal line connected a row scanning circuit is connected to a gate electrode 42g of the address transistor 42. Note that an interconnect layer 96 is disposed in the insulating layer 90. The output signal line 74, the address signal line, and the like described above are included as part of the interconnect layer 96.

Exemplary Configuration and Light Detection Mechanism of Permittivity Modulation Element As described above, the permittivity modulation element 20a includes the permittivity modulation structure 26a sandwiched between the pixel electrode 22e and the opposite electrode 21e. In the configuration exemplified in FIG. 2, the permittivity modulation structure 26a has a laminate structure including a first charge-blocking layer 23, a second charge-blocking layer 24, and a photoelectric conversion layer 25 positioned between the blocking layers.

The photoelectric conversion layer 25 generates excitons internally when irradiated with light. A typical example of the material of the photoelectric conversion layer 25 is a semiconductor material. The following illustrates an example of an organic semiconductor material as the material forming the photoelectric conversion layer 25. For example, a compound semiconductor material as typified by materials such as amorphous silicon hydride and CdSe, or a metal oxide compound semiconductor such as ZnO is also usable as the material of the photoelectric conversion layer 25.

In the case where the photoelectric conversion layer 25 contains an organic semiconductor material, the photoelectric conversion layer 25 may also have a laminate structure of a donor organic compound and an acceptor organic compound, or in other words, a heterojunction. Alternatively, a mixed layer having a bulk heterojunction structure may be included. The photoelectric conversion layer 25 may also be a combination of the above. Light incident on the photoelectric conversion layer 25 may be absorbed by one or both of the donor organic compound and the acceptor organic compound.

The first charge-blocking layer 23 is positioned between the opposite electrode 21e and the photoelectric conversion layer 25, and suppresses the exchange of charge between the opposite electrode 21e and the photoelectric conversion layer 25. In other words, the first charge-blocking layer 23 has a function of suppressing the movement of charge from the photoelectric conversion layer 25 to the opposite electrode 21e and the movement of charge from the opposite electrode 21e to the photoelectric conversion layer 25. Similarly, the second charge-blocking layer 24 is positioned between the pixel electrode 22e and the photoelectric conversion layer 2, and suppress the movement of charge from the photoelectric conversion layer 25 to the pixel electrode 22e and the movement of charge from the pixel electrode 22e to the photoelectric conversion layer 25.

As described in detail later, in the detection of light, by having the voltage supply circuit 50 apply a predetermined voltage to the opposite electrode 21e for example, a potential difference is established between the opposite electrode 21e and the pixel electrode 22e. Consequently, the permittivity modulation structure 26a enters a state in which an electric field is applied from the outside. For this reason, in the hypothetical case where the permittivity modulation structure 26a is not provided with the first charge-blocking layer 23 for example, if the opposite electrode 21e is given a high potential with respect to the pixel electrode 22e, negative charge may move from the photoelectric conversion layer 25 to the opposite electrode 21e, while positive charge may move from the opposite electrode 21e to the photoelectric conversion layer 25.

Conversely, by providing the first charge-blocking layer 23 between the opposite electrode 21e and the photoelectric conversion layer 25, the movement of charge between the photoelectric conversion layer 25 and the opposite electrode 21e can be suppressed, and charge in the photoelectric conversion layer 25 can be kept in the photoelectric conversion layer 25. For example, in the case where the opposite electrode 21e is given a high potential with respect to the pixel electrode 22e, by disposing an electron-blocking layer as the first charge-blocking layer 23, the movement of electrons from the photoelectric conversion layer 25 to the opposite electrode 21e can be limited. Similarly, by disposing a hole-blocking layer as the second charge-blocking layer 24, the movement of holes from the photoelectric conversion layer 25 to the pixel electrode 22e can be limited.

Herein, the incident of light through the opposite electrode 21e causes the photoelectric conversion layer 25 to generate excitons in the photoelectric conversion layer 25. If excitons are generated while the movement of charge between the photoelectric conversion layer 25 and the electrodes is in a suppressed state, the charge density at the opposite electrode 21e and the pixel electrode 22e increases. The generation of excitons in a state in which a potential difference is established between the opposite electrode 21e and the pixel electrode 22e contributes to a change in the polarization of the permittivity modulation structure 26a. For this reason, the increase of charge blocking at the electrodes results in an increase of permittivity between the opposite electrode 21e and the pixel electrode 22e, or in other words, an increase in the permittivity of the permittivity modulation structure 26a. It may also be said that the capacitance value between the opposite electrode 21e and the pixel electrode 22e changes due to the radiation of light. By detecting the change in the permittivity of the permittivity modulation structure 26a in the form of a voltage change for example with the detection circuit 40, light can be detected.

The material used for the first charge-blocking layer 23 and the second charge-blocking layer 24 may be an organic material, for example. As described above, the photoelectric conversion layer 25 may mainly contain an organic semiconductor material. In other words, the permittivity modulation structure 26a may have a structure of substantially organic material.

The material of the first charge-blocking layer 23 and the second charge-blocking layer 24 is not limited to an insulating material. As described below, by appropriately selecting the materials of adjacent layers or electrodes, a material having properties whereby charge of one polarity is transported due to an application of voltage, but charge of the opposite polarity is not transported, may be used as the material of the first charge-blocking layer 23 and the second charge-blocking layer 24.

For example, in the case where the opposite electrode 21e is given a high potential with respect to the pixel electrode 22e, a hole-transporting organic compound may be used as the material of the first charge-blocking layer 23. At this time, using a conductive material with a shallower Fermi level than the energy level of the highest occupied molecular orbital of the first charge-blocking layer 23 as the material of the opposite electrode 21e makes it possible to utilize the Schottky barrier between the electrodes to suppress both the movement of holes from the opposite electrode 21e to the first charge-blocking layer 23 and the movement of electrons from the first charge-blocking layer 23 to the opposite electrode 21e. Similarly, in the case where the opposite electrode 21e is given a high potential with respect to the pixel electrode 22e, an electron-transporting organic compound may be used as the material of the second charge-blocking layer 24. At this time, using a conductive material with a deeper Fermi level than the energy level of the lowest unoccupied molecular orbital of the second charge-blocking layer 24 as the material of the pixel electrode 22e makes it possible to suppress both the movement of electrons from the pixel electrode 22e to the second charge-blocking layer 24 and the movement of holes from the second charge-blocking layer 24 to the pixel electrode 22e. Hereinafter, the energy level of the highest occupied molecular orbital is simply referred to as the "HOMO level", and the energy level of the lowest unoccupied molecular orbital is simply referred to as the "LUMO level".

For example, consider the movement of charge in a configuration in which the photoelectric conversion layer 25 has a LUMO level of 4.0 eV and the electrode material of the pixel electrode 22e has a Fermi level of 5.1 eV. For example, TiN described above is an electrode material having a Fermi level approximately from 5.1 eV to 5.2 eV, and may be applied as the material of the pixel electrode 22e.

In this case, a hole-blocking layer formed from an electron-transporting organic compound can be used for the second charge-blocking layer 24. With such a combination of energy levels, if the HOMO level of the second charge-blocking layer 24 is deeper than 5.1 eV, the energy barrier is raised in the hole-transporting process between the photoelectric conversion layer 25 and the second charge-blocking layer 24, and the ability to impede the movement of holes is improved. For example, fullerene has a LUMO level of 4.0 eV and a HOMO level of 6.4 eV. Consequently, fullerene can be applied as the material of the second charge-blocking layer 24 in this case. Note that as the LUMO level of the second charge-blocking layer 24 becomes equal to or deeper than 4.0 eV, the energy barrier is lowered in the electron-transporting process, and the transport efficiency of electrons from the photoelectric conversion layer 25 to the pixel electrode 22e is improved. However, the above assumes the case where the opposite electrode 21e is given a high potential with respect to the pixel electrode 22e, and such electron movement does not have to be considered.

The materials of the first charge-blocking layer 23 and the second charge-blocking layer 24 can be selected from publicly available materials with consideration for factors such as the bond strength between adjacent layers, the stability, differences in ionization potential, and differences in electron affinity. It is possible to obtain the effect of keeping charge in the photoelectric conversion layer 25 by providing at least one of the first charge-blocking layer 23 and the second charge-blocking layer 24 in the permittivity modulation structure 26a. The above example describes a case in which the first charge-blocking layer 23, the second charge-blocking layer 24, and the photoelectric conversion layer 25 are organic materials, but in the case where these layers are inorganic compounds, it is sufficient to replace "HOMO" with "valence band" and "LUMO" with "conduction band". Note that the HOMO level of an organic material can be found by a method such as photoelectron spectroscopy or photoelectron yield spectroscopy, for example. Also, the LUMO level can be found by inverse photoelectron spectroscopy, or by subtracting the energy of the absorption edge from the HOMO level.

Alternatively, an insulating layer may be disposed instead of one or both of the first charge-blocking layer 23 and the second charge-blocking layer 24. In this case, the insulating layer may be disposed between the opposite electrode 21e and the photoelectric conversion layer 25 or between the pixel electrode 22e and the photoelectric conversion layer 25. Furthermore, the insulating layer may also be disposed both between the opposite electrode 21e and the photoelectric conversion layer 25 and between the pixel electrode 22e and the photoelectric conversion layer 25. For the material of the insulating material, an oxide such as $SiO_2$, $Al_2O_3$, $HfO_2$, $ZrO_2$, a nitride such as SiN, a compound obtained by combining the above, or an organic material such as poly (methyl methacrylate) resin (PMMA), polyimide, or polystyrene can be broadly used.

Figure 3:
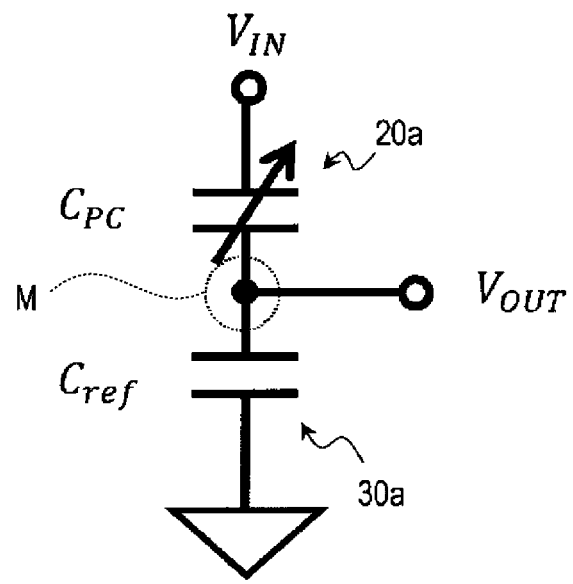
FIG. 3 is an equivalent circuit diagram related to a permittivity modulation element and an impurity region that acts as a capacitive element in a pixel.

Hereinafter, the principle of detecting light intensity from a change in the potential of the second terminal 22 will be described. FIG. 3 is an equivalent circuit diagram related to the permittivity modulation element 20a and the impurity region 30a that acts as the capacitive element 30 in the pixel 10Aa.

As described with reference to FIG. 2, the permittivity modulation structure 26a in the permittivity modulation element 20a changes permittivity depending on the amount of incident light. Also, because the permittivity modulation structure 26a includes a charge-blocking layer or an insulating layer, direct current basically does not flow between the permittivity modulation structure 26a and the pixel electrode 22e. Given the above, in FIG. 3, a circuit symbol similar to a variable capacitor is used to represent the permittivity modulation element 20a out of convenience.

In the equivalent circuit illustrated in FIG. 3, $V_{IN}$ denotes the voltage applied on the first terminal 21 side of the permittivity modulation element 20a, or in other words, the voltage applied to the opposite electrode 21e from the voltage supply circuit 50. Also, $V_{OUT}$ denotes the voltage on the second terminal 22 side of the permittivity modulation element 20a, or in other words, the voltage at a node M between the permittivity modulation element 20a and the capacitive element 30 (for example, the impurity region 30a). The detection circuit 40 described above is connected to the node M. Consequently, the detection circuit 40 described above outputs a signal corresponding to the voltage $V_{OUT}$. Note that the pair of the signal detection transistor 41 and the address transistor 42 illustrated in FIG. 1 is merely one example of the detection circuit 40, and the configuration of the detection circuit 40 is not limited to the configuration illustrated in FIG. 1 insofar as a similar function is achieved.

Provided that $C_{PC}$ is the capacitance value of the permittivity modulation structure 26a in the permittivity modulation element 20a and $C_{ref}$ is the capacitance value of the impurity region 30a acting as the capacitive element 30, the voltage $V_{OUT}$ of the node M is expressed by the following Formula (1).

$$V_{OUT} = \frac{C_{PC}}{C_{PC} + C_{ref}} V_{IN} \qquad (1)$$

When light is incident on the photoelectric conversion layer 25, the charge density increases in the opposite electrode 21e and the pixel electrode 22e due to the generation of excitons, and the capacitance value between the opposite electrode 21e and the pixel electrode 22e changes. In other words, the capacitance value $C_{PC}$ changes depending on the radiation of light. At this time, it is assumed that the capacitance value $C_{ref}$ of the capacitive element 30 changes little or not at all due to the radiation of light on the pixel 10Aa, and the change of the capacitance value $C_{ref}$ due to the radiation of light is sufficiently small compared to the change of the capacitance value $C_{PC}$. In this case, the voltage $V_{OUT}$ of the node M changes in accordance with the change of the capacitance value $C_{PC}$ of the permittivity modulation structure 26a.

Figure 4:
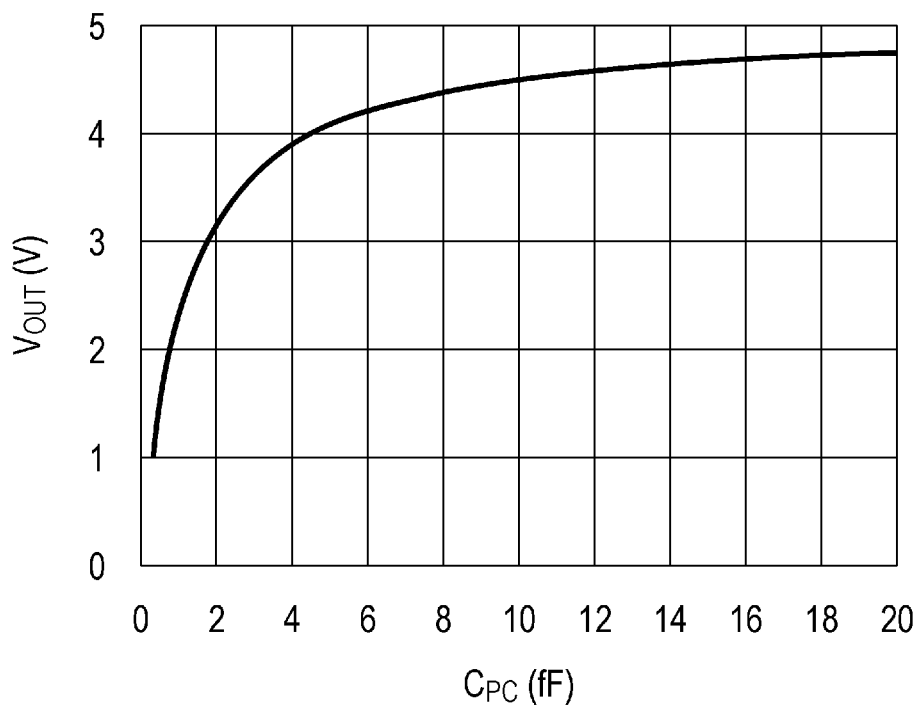
FIG. 4 is a graph illustrating the results of calculating $V_{OUT}$ with respect to change in a capacitance value $C_{PC}$ when $V_{IN}$=5V and $C_{ref}$=1.2 fF.

FIG. 4 illustrates the change in $V_{OUT}$ with respect to the change in the capacitance value $C_{PC}$ when a 5 V voltage is applied as $V_{IN}$ and $C_{ref}$ is 1.2 fF. As FIG. 4 demonstrates, the increase in the capacitance value $C_{PC}$ due to the radiation of light also causes a rise in the potential of the second terminal 22, namely $V_{OUT}$. Consequently, by connecting the detection circuit 40 to the node M, it is possible to detect a change in the light intensity on the pixel 10Aa in the form of a change in the input voltage into the signal detection transistor 41 that acts as a source follower. Note that, as Formula (1) demonstrates, if the initial value of the capacitance value $C_{PC}$, which may be the capacitance value $C_{PC}$ of the permittivity modulation structure 26a in a non-irradiated state, for example, is a large value with respect to the capacitance value $C_{ref}$, the change in the voltage $V_{OUT}$ is small with respect to an increase in the capacitance value $C_{PC}$ due to the radiation of light. For this reason, it is beneficial for the capacitive element 30 to have a relatively large capacitance value with respect to the initial value of the capacitance value $C_{PC}$.

In this way, according to the embodiment of the present disclosure, light can be detected through a change in the permittivity of the permittivity modulation element 20 due to the radiation of light. Furthermore, in the embodiment of the present disclosure, charge is not taken out of the permittivity modulation element 20, unlike a configuration that reads out the amount of charge by taking out the holes or electrons produced by photoelectric conversion as a signal charge. For this reason, the voltage applied to the permittivity modulation element 20 from the voltage supply circuit 50 is controlled to make the potential difference between the opposite electrode 21e and the pixel electrode 22e approach 0 V, for example. With this arrangement, the positive and negative charge in the permittivity modulation structure 26a recombines quickly, and the permittivity of the permittivity modulation structure 26a that has risen due to the radiation of light falls. In other words, according to the embodiment of the present disclosure, a reset operation performed by supplying a reset voltage is basically unnecessary.

Exemplary Operations of Imaging Device

Figure 5:
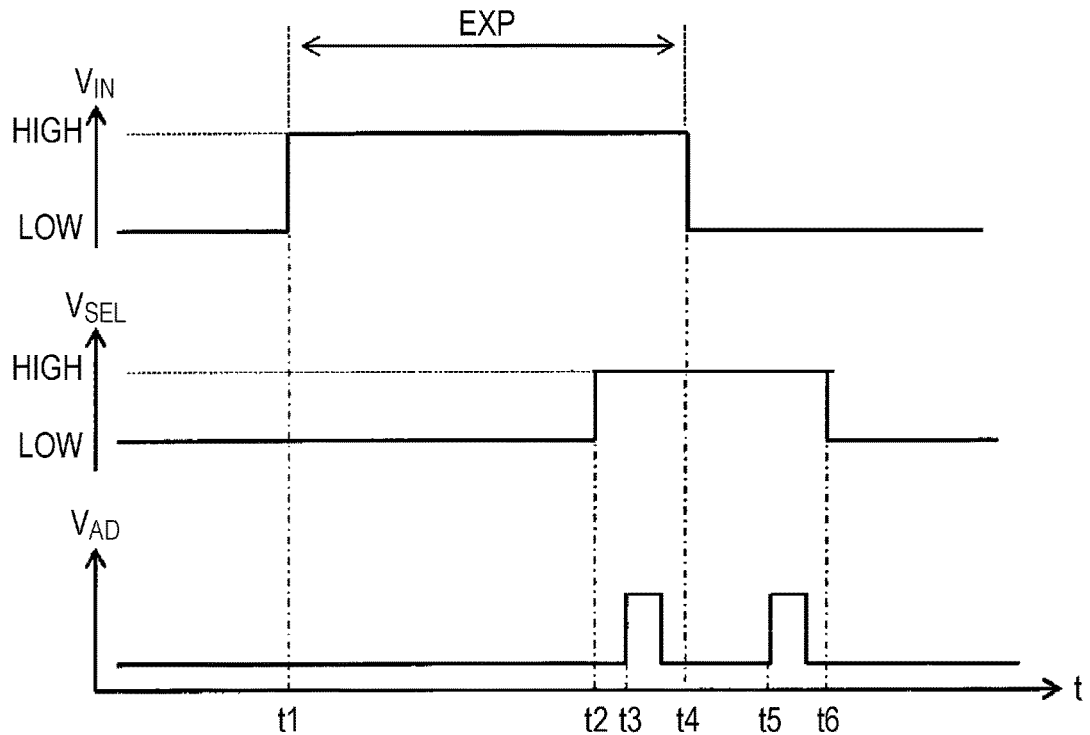
FIG. 5 is a timing chart for explaining exemplary operations of the imaging device according to an embodiment of the present disclosure.

Next, exemplary operations of the imaging device according to the embodiment of the present disclosure will be described. FIG. 5 is a timing chart for explaining exemplary operations of the imaging device according to the embodiment of the present disclosure. In FIG. 5, the upper graph illustrates the change in the voltage $V_{IN}$ supplied from the voltage supply circuit 50 to the power line 70, while the middle graph illustrates the change in a potential $V_{SEL}$ of the address signal line connected to the gate of the address transistor 42. The lower graph illustrates the change in a voltage $V_{AD}$ for controlling the driving of the AD conversion circuits 62.

As described above, the voltage supply circuit 50 has a configuration capable of switching between at least two different voltages. Herein, it is assumed that the voltage supply circuit 50 is capable of selectively supplying a high-level first voltage or a low-level second voltage lower than the first voltage to the power line 70. As Formula (1) above demonstrates, the voltage $V_{OUT}$ applied to the gate of the signal detection transistor 41 of the detection circuit 40 is proportional to the voltage $V_{IN}$ applied to the first terminal 21 of the permittivity modulation element 20, or in other words, the voltage that the voltage supply circuit 50 applies to the power line 70. As described above, the capacitance value $C_{PC}$ of the permittivity modulation structure 26a changes according to the light intensity, and the voltage $V_{OUT}$ also changes correspondingly, but if the voltage $V_{IN}$ is small, the change in the voltage $V_{OUT}$ in association with a change in the light intensity is also small. As illustrated in FIG. 3, herein, the potential of the electrode of the capacitive element 30 on the side not connected to the node M is grounded. For this reason, if the low-level second voltage is for example ground, that is, 0 V, the voltage $V_{OUT}$ applied from the gate of the signal detection transistor 41 is basically 0 V regardless of the light intensity. Consequently, the period during which the voltage supply circuit 50 applies the low-level second voltage to the power line 70 can be said to correspond to a non-exposure period.

In the example illustrated in FIG. 5, in the initial state, the second voltage is being applied to the power line 70. Herein, it is assumed that the second voltage is 0 V.

At a time t1, the voltage supply circuit 50 sets the voltage to apply to the power line 70 to the high-level first voltage. As Formula (1) and FIG. 4 demonstrate, setting the voltage $V_{IN}$ to be applied to the opposite electrode 21e of the permittivity modulation element 20a to the first voltage causes the voltage $V_{OUT}$ to change in association with the change of the capacitance value $C_{PC}$ corresponding to the light intensity. In other words, a state is reached in which the voltage $V_{OUT}$ corresponding to the light intensity is applied to the gate of the signal detection transistor 41.

Next, at a time t2, the potential $V_{SEL}$ of the address signal line is set to the high level, and the address transistor 42 is turned on. By turning on the address transistor 42, a signal corresponding to the light intensity is output from the detection circuit 40 of the selected pixel 10A to the output signal line 74. In this example, a voltage signal corresponding to the light intensity is output to the output signal line 74.

In the example illustrated in FIG. 5, the driving pulse of the AD conversion circuit 62 is raised at a time t3. In other words, the AD conversion circuit 62 is operated in a state in which the voltage supply circuit 50 is supplying the high-level first voltage to the power line 70 and the address transistor 42 is turned on. The digital value obtained at this time by the operation of the AD conversion circuit 62 is a pixel signal corresponding to the light intensity in this example.

Next, at a time t4, the voltage supply circuit 50 switches the voltage to supply to the power line 70 to the low-level second voltage. By switching the voltage supplied to the power line 70 to the second voltage, the potential difference between the opposite electrode 21e and the pixel electrode 22e is reduced, and the pairs of positive and negative charge generated in the photoelectric conversion layer 25 due to the radiation of light quickly recombine. Particularly, because the second voltage is set to 0 V in this case, the voltage $V_{OUT}$ becomes 0 V. In other words, the voltage $V_{OUT}$ applied to the gate of the signal detection transistor 41 returns to the state before the high-level first voltage was supplied to the power line 70. That is, in the embodiment of the present disclosure, the period during which the voltage supply circuit 50 supplies a relatively high voltage to each pixel 10A can be treated as an exposure period. The double-headed arrow EXP in FIG. 5 schematically represents the exposure period.

After the voltage supplied to the power line 70 is switched to the second voltage, the driving pulse of the AD conversion circuit 62 is raised again at a time t5. Through the operation of the AD conversion circuit 62, a digital value corresponding to a reference-level signal before the high-level first voltage was supplied to the power line 70 is obtained. By executing a readout in the second period while the second voltage is being supplied to the power line 70, it is possible to read out a reference-level signal without being influenced by the magnitude of the light intensity.

The signal processing circuit 60 generates and outputs the difference between the digital value obtained at the time t3 and the digital value obtained at the time t5. In other words, the signal processing circuit 60 generates, as a signal indicating the light intensity of an object, the difference between the pixel signal obtained in the period while the high-level first voltage is being supplied to the power line 70 and the reference-level signal obtained in the period while the low-level second voltage is being supplied to the power line 70. After that, the address transistor 42 is turned off at a time t6.

The voltage $V_{OUT}$ is detected by the detection circuit 40 for each of the first period during which the voltage supply circuit 50 applies the first voltage to the first terminal 21 and the second period during which the voltage supply circuit 50 applies the second voltage different from the first voltage, and the difference between the outputs from the detection circuit 40 in each of the periods is taken. The signal component obtained in this way has a reduced noise component compared to the case of directly outputting the signal component obtained while the high-level voltage is being applied to the first terminal 21 as a signal indicating the light intensity of the object. Note that the order of the detection of the pixel signal and the detection of the reference-level signal is not limited to the example illustrated in FIG. 5, and the detection of the reference-level signal may also be executed first. Also, the difference between the outputs from the detection circuit 40 is not limited to being a difference between digital values, and may also be a difference between the amplitudes of analog waveforms, for example.

Figure 6:
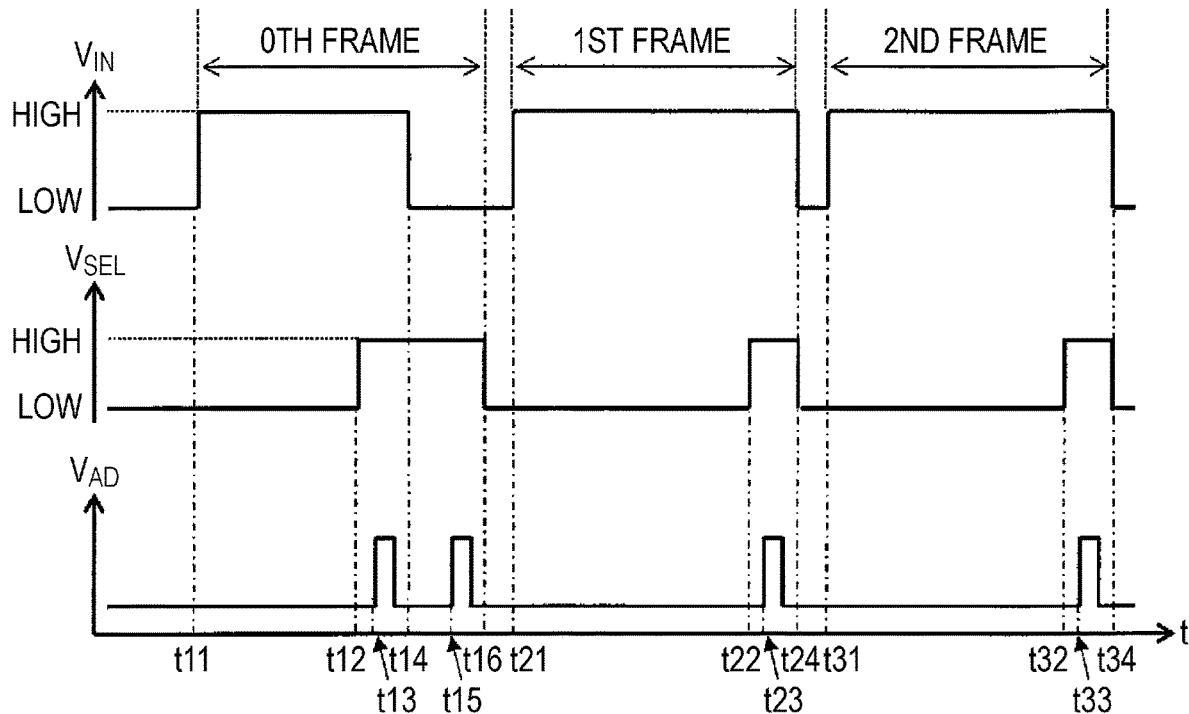
FIG. 6 is a timing chart for explaining one example of imaging operations over a plurality of frames.

FIG. 6 illustrates one example of imaging operations over a plurality of frames. In the example illustrated in FIG. 6, first, the voltage applied from the voltage supply circuit 50 to the power line 70 is set to the high-level first voltage at a time t11. The start of the application of the first voltage by the voltage supply circuit 50 corresponds to the start of the exposure period of a 0th frame period. After a predetermined period elapses, the address transistor 42 is turned on at a time t12, for example. Furthermore, by causing the AD conversion circuit 62 to operate at a time t13, a pixel signal corresponding to the light intensity is obtained.

After obtaining the pixel signal corresponding to the light intensity, at a time t14, the voltage applied from the voltage supply circuit 50 to the power line 70 is switched to the low-level second voltage. As described with reference to FIG. 5, the timing of switching to the second voltage corresponds to the end of the exposure period of the 0th frame period.

Next, while in the state in which the second voltage is being supplied from the voltage supply circuit 50, the AD conversion circuit 62 is operated again at a time t15, and a reference-level signal is acquired. After that, the address transistor 42 is turned off at a time t16, and the 0th frame period ends. The signal processing circuit 60 generates the difference between the pixel signal and the reference-level signal obtained at the time t15 as a signal indicating the light intensity of the object.

After that, at a time t21, the voltage that the voltage supply circuit 50 applies to the power line 70 is again switched to the high-level first voltage, thereby starting the next frame period, namely, a 1st frame period.

After the 1st frame period starts, by turning on the address transistor 42 at a time t22 and causing the AD conversion circuit 62 to operate at a time t23, a pixel signal corresponding to the light intensity related to the 1st frame is acquired.

After the acquisition of the pixel signal related to the 1st frame, at a time t24, the voltage applied to the power line 70 is switched to the low-level second voltage and additionally the address transistor 42 is turned off. Furthermore, the voltage applied to the power line 70 is again switched to the first voltage at a time t31, without executing the acquisition of the reference-level signal. In other words, a 2nd frame period is started.

At this point, the signal processing circuit 60 generates the difference between the pixel signal obtained at the time t23 and the reference-level signal obtained at the time t15 during the 0th frame period as a signal indicating the light intensity of the object. According to a typical embodiment of the present disclosure, by reverting the voltage $V_{IN}$ to be applied to the first terminal 21 to the initial state, or in other words, by reverting the voltage that the voltage supply circuit 50 applies to the power line 70 to the low-level second voltage, the state of the permittivity modulation element 20 may be reverted to the state before being irradiated with light. In other words, it is possible to substantially reset the potential of the node M without executing a reset operation by supplying a reset voltage to the pixel. For this reason, the introduction of reset noise associated with a reset operation can be avoided, and variations in the reference levels between frames due to the introduction of reset noise can be avoided. This is a particularly advantageous point from the perspective of securing a favorable SN ratio in cases of low light intensity. Because variations in the reference levels between frames do not occur, if a reference-level signal is acquired once during the first of consecutive frame periods, it is possible to reuse the reference-level signal for the subsequent frame periods.

The operations in the succeeding 2nd frame period may be similar to the operations in the 1st frame period. In this example, the address transistor 42 is turned on at a time t32, the AD conversion circuit 62 is made to operate at a time t33, and a pixel signal corresponding to the light intensity related to the 2nd frame is acquired. After the acquisition of the pixel signal, by switching the voltage $V_{IN}$ to the second voltage and turning off the address transistor 42 at a time t34, the 2nd frame period ends. Like the 1st frame, the signal processing circuit 60 generates the difference between the pixel signal obtained at the time t33 and the reference-level signal obtained during the 0th frame period as a signal indicating the light intensity of the object.

In this way, in two or more consecutive frame periods, the number of times that a signal is read out through the detection circuit 40 while the voltage supply circuit 50 is supplying the second voltage to each pixel 10A may be fewer than the number of times that a signal is read out through the detection circuit 40 while the voltage supply circuit 50 is supplying the first voltage. In other words, the number of times that a reference-level signal is read out may be fewer than the number of times that a pixel signal corresponding to the light intensity is read out. According to such operations, because the acquisition of the reference-level signal in every frame period is omitted, the period taken for signal readout is shortened, and imaging may be executed at high speed. Alternatively, the exposure period can be lengthened to the degree that the acquisition of the reference-level signal in every frame period is omitted, and a higher SN ratio is achievable.

Figure 7:
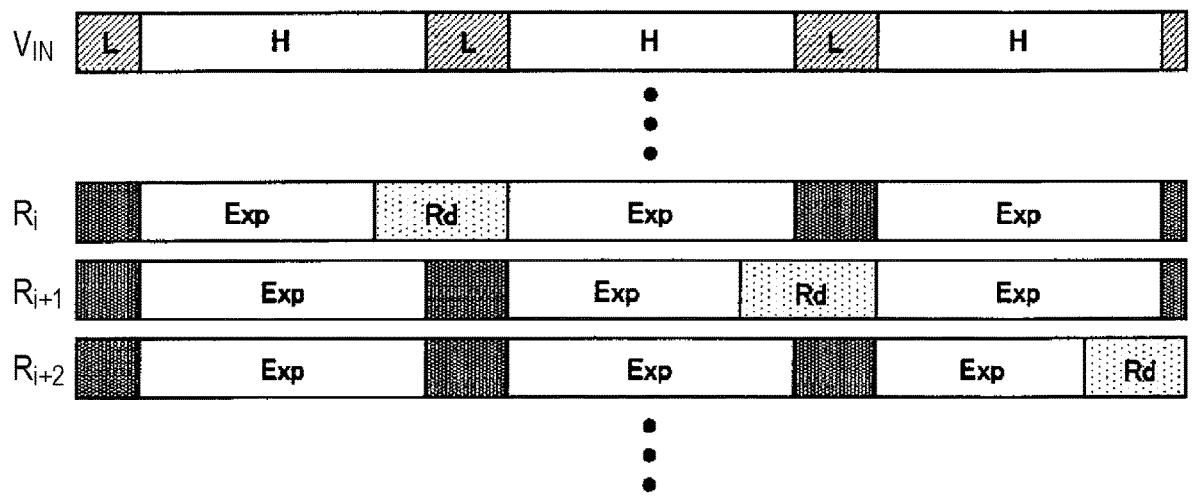
FIG. 7 is a diagram for explaining one example of readout operations by an imaging device that includes a plurality of pixels arranged in a two-dimensional matrix.

FIG. 7 schematically illustrates one example of readout operations by an imaging device that includes a plurality of pixels arranged in a two-dimensional matrix. In FIG. 7, the white rectangles H on the uppermost row represent the first period during which the voltage supply circuit 50 applies the high-level first voltage to the first terminal 21, while the hatched rectangles L represent the second period during which the voltage supply circuit 50 applies the low-level second voltage to the first terminal 21. Note that herein, a common voltage is applied to the opposite electrode 21e of each pixel 10Aa.

In FIG. 7, for simplicity, the operations of a pixel belonging to the ith row, a pixel belonging to the (i+1)th row, and a pixel belonging to the (i+2)th row from among the plurality of rows are illustrated as a representative example. In FIG. 7, the white rectangles Exp represent the exposure periods on each row, while the shaded rectangles Rd represent the signal readout periods. Herein, the readout of a pixel signal and the readout of a reference-level signal are executed at the timings indicated by the rectangles Rd. The readout of a pixel signal is executed in the first period, and the readout of a reference-level signal is executed in a second period. As described above, according to the embodiment of the present disclosure, the acquisition of the reference-level signal in every frame period may be omitted. In this example, the readouts of a pixel signal and a reference-level signal are executed successively by shifting the timings in units of rows.

Figure 8:
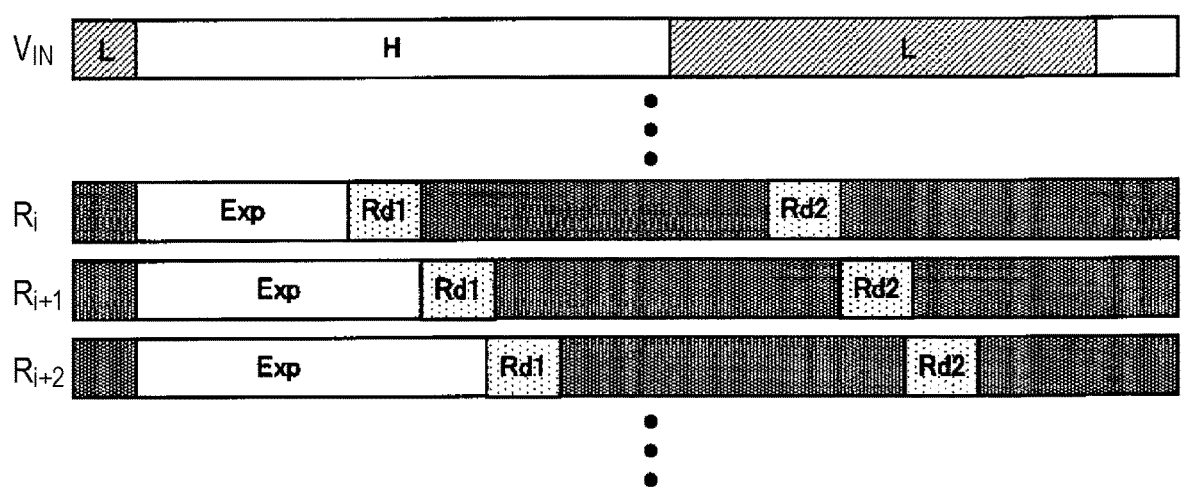
FIG. 8 is a diagram for explaining another example of readout operations by an imaging device that includes a plurality of pixels arranged in a two-dimensional matrix.

FIG. 8 schematically illustrates another example of readout operations by an imaging device that includes a plurality of pixels arranged in a two-dimensional matrix. In FIG. 8, the shaded rectangles Rd1 represent the pixel signal readout periods, while the shaded rectangles Rd2 represent the reference-level signal readout periods. In this example, the pixel signal readout is successively executed in units of rows in the first period, and additionally, the reference-level signal readout is successively executed in units of rows in the second period. Like in this example, the voltage switch from the first voltage to the second voltage and the voltage switch from the second voltage to the first voltage are performed one time each in a single frame period.

Figure 9:
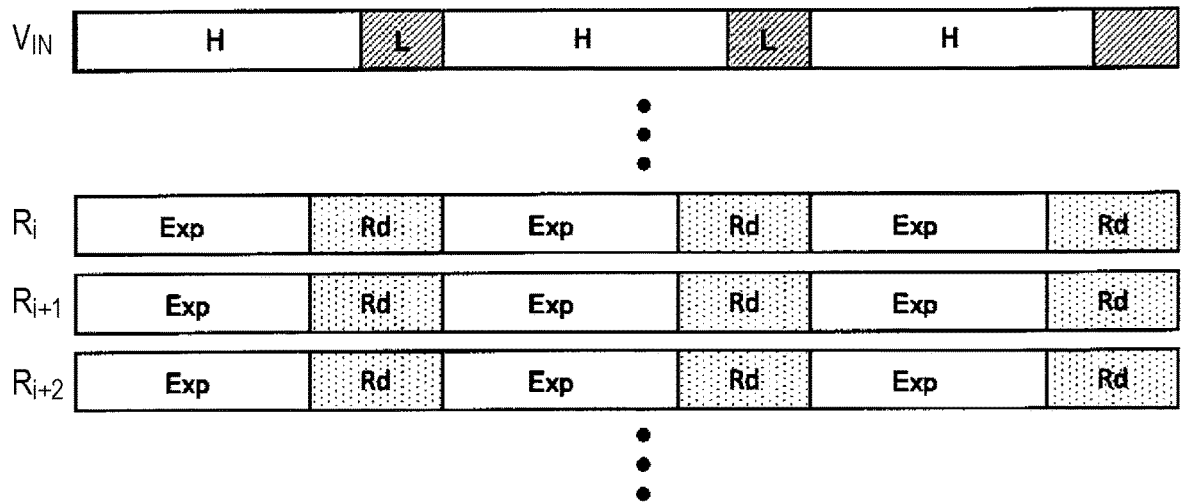
FIG. 9 is a diagram for explaining yet another example of readout operations by an imaging device that includes a plurality of pixels arranged in a two-dimensional matrix.
Figure 10:
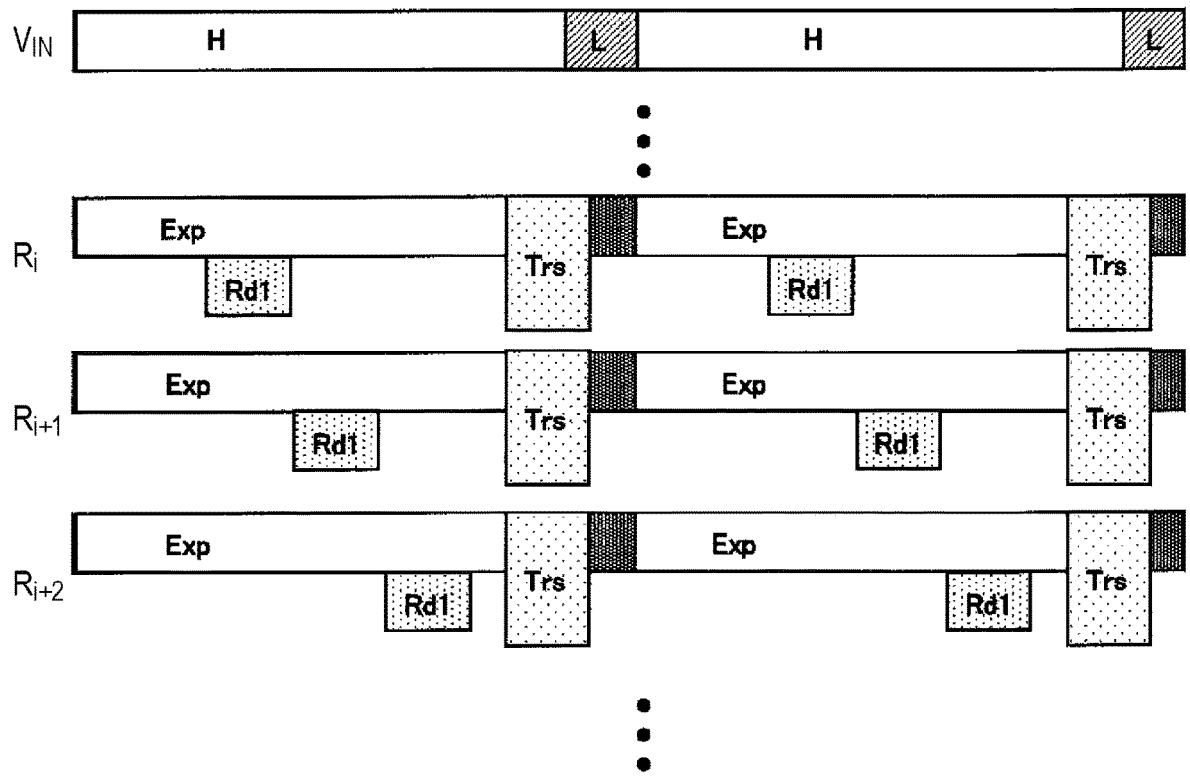
FIG. 10 is a diagram for explaining yet another example of readout operations by an imaging device that includes a plurality of pixels arranged in a two-dimensional matrix.

FIGS. 9 and 10 schematically illustrate yet another example of readout operations by an imaging device that includes a plurality of pixels arranged in a two-dimensional matrix. In the example illustrated in FIG. 9, signal readouts are executed at a common timing for all rows in each frame period, and all pixels share a common beginning and end of the exposure period. In other words, what is referred to as a global shutter is realized.

Such readout operations are achievable by disposing the signal processing circuit 60 and an XY decoder that designates specific pixels in the imaging region on a chip separate from the chip where the imaging region is formed, and for example stacking these chips to electrically connect each row of the plurality of pixels to the signal processing circuit 60. An analog-to-digital conversion circuit may also be disposed for each pixel. According to chip stacking technology, an imaging device suited to such a readout method may be achieved while also avoiding bulkier pixels.

Similarly, in the example illustrated in FIG. 10, all pixels share a common beginning and end of the exposure period. FIG. 10 is an example of operations applicable to pixels that include a frame memory. In FIG. 10, the shaded rectangles Trs represent periods in which information related to the signal level is transferred to the frame memory. FIG. 10 is an example in which the voltage level of the pixel signal obtained during the exposure period is transferred to the frame memory, and the voltage level of the pixel signal is read out from the frame memory during the exposure period of the next frame period. Note that it is sufficient to execute the readout of the reference-level signal in the second period during any of the frame periods.

Figure 11:
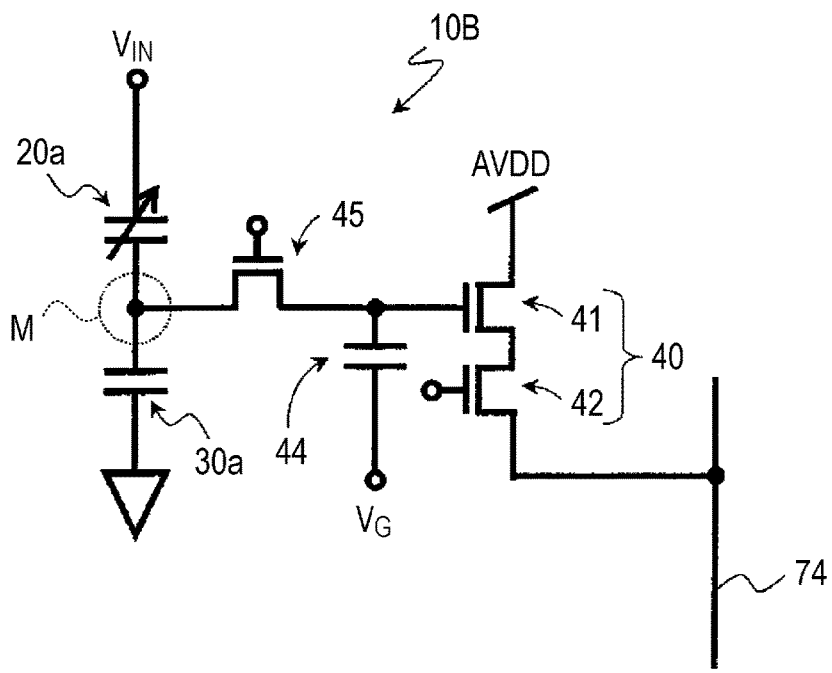
FIG. 11 is a diagram illustrating an example of a pixel including a frame memory.

FIG. 11 illustrates an example of a pixel including a frame memory. A pixel 10B illustrated in FIG. 11 includes a pair of a transfer transistor 45 connected between the node M and the gate of the signal detection transistor 41, and a capacitive element 44 of which one electrode is connected to the gate of the signal detection transistor 41. By connecting the other electrode of the capacitive element 44 to a power source not illustrated for example, it is possible to apply a predetermined voltage $V_G$ while the imaging device 100A is operating.

By turning on and then turning off the transfer transistor 45 after a predetermined period elapses from the beginning of the first period, the voltage level of the node M after the exposure period is temporarily held by the capacitive element 44. By turning on the address transistor 42 after causing the voltage level to be held in the capacitive element 44, a signal corresponding to the voltage level held in the capacitive element 44 can be read out to the output signal line 74 at a desired timing. The turning on and off of the transfer transistor 45 may be controlled by a row scanning circuit not illustrated, for example. Note that from the perspective of increasing sensitivity, it is beneficial for the capacitive element 44 to have a smaller capacitance value than the capacitance value of the capacitive element 30 (for example, the impurity region 30a).

Removal of Offset Level

As described above, according to the embodiment of the present disclosure, by causing the potential difference between the first terminal 21 and the second terminal 22 to approach 0 V, the potential of the node M can be set substantially to 0 V regardless of the radiation of light, thereby making the reset operation demanded by a typical imaging device basically unnecessary. However, as an example, suppose that the voltage imparted to the electrode on the side not connected to the node M among the electrodes of the capacitive element 30 and the second voltage that the voltage supply circuit 50 applies to the permittivity modulation element 20 do not match. In such a case, if the voltage applied to the permittivity modulation element 20 is switched to the first voltage, the potential of the node M may rise from 0 V even if light is not being radiated. Provided that $\Delta V$ is the difference between the second voltage applied from the voltage supply circuit 50 to the opposite electrode 21e and the voltage imparted to the side not connected to the node M among the electrodes of the capacitive element 30, and $C_{ini}$ is the capacitance value of the permittivity modulation structure 26a in the dark state, an offset $V_{offset}$ of the voltage $V_{OUT}$ produced by switching to the first voltage is given according to the following Formula (2).

$$V_{offset} = \frac{C_{ini}}{C_{ini} + C_{ref}} \Delta V \qquad (2)$$

In the case where such a voltage offset exists, the original output corresponding to the amount of change in the permittivity due to the radiation of light is given by the following Formula (3) from which the offset is subtracted.

$$V_{OUT} = \left( \frac{C_{PC}}{C_{PC} + C_{ref}} - \frac{C_{ini}}{C_{ini} + C_{ref}} \right) V_{IN} \qquad (3)$$

In other words, by additionally subtracting the signal corresponding to the offset level described above from the difference between the pixel signal and the reference-level signal, the effective change in the voltage level corresponding to the change in the permittivity due to the radiation of light can be acquired, regardless of the amount of charge stored in the node M in the initial state. For example, the signal processing circuit 60 may output, as a signal indicating the light intensity of an object, the signal obtained by additionally subtracting the signal corresponding to the offset level from the difference between the pixel signal obtained in the period while the high-level first voltage is being supplied to the power line 70 and the reference-level signal obtained in the period while the low-level second voltage is being supplied to the power line 70. The subtraction of the signal corresponding to the offset level may be executed as a subtraction between digital signals or as a subtraction between analog signals. By subtracting the signal corresponding to the offset level, it is possible to reduce fixed-pattern noise arising from inconsistencies in the offset level for each pixel.

Acquisition of Signal Corresponding to Offset Level

The signal corresponding to the offset level is the signal that the detection circuit 40 outputs in a state in which the permittivity modulation element 20 is not being irradiated with light, and additionally, the first voltage is not being supplied to the power line 70 from the voltage supply circuit 50. As described below, the signal corresponding to the offset level is acquirable by various methods.

Figure 12:
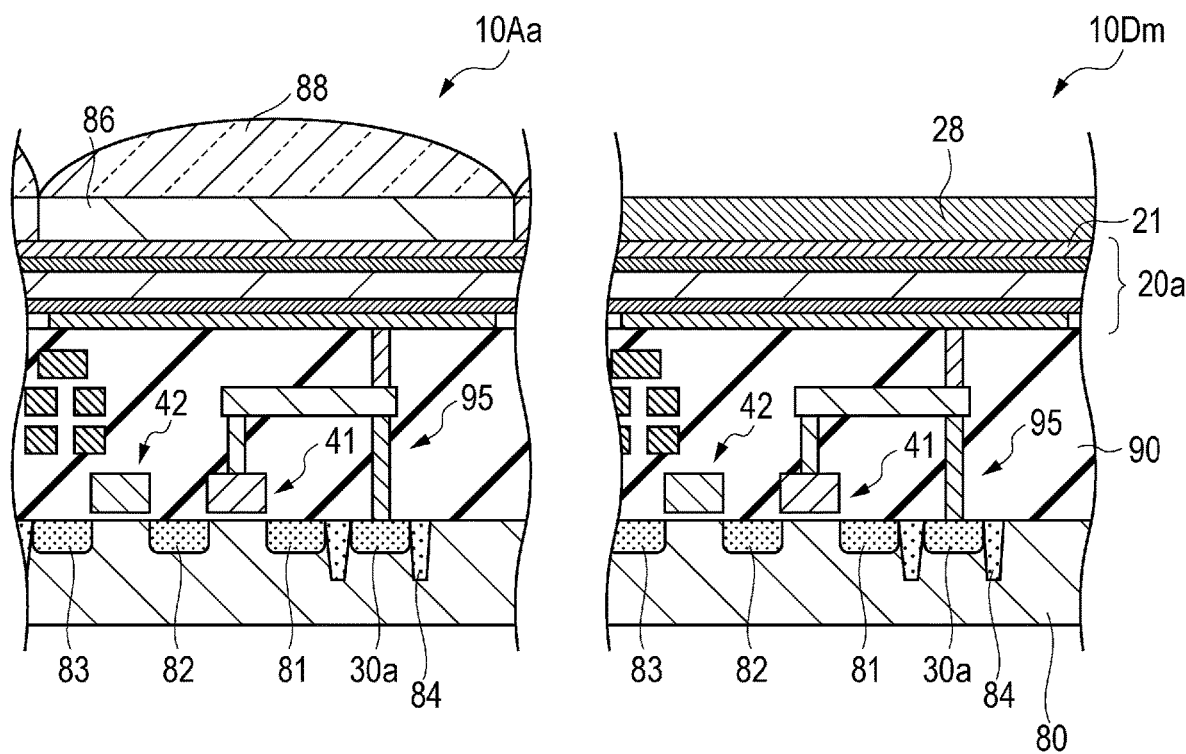
FIG. 12 is a schematic cross-sectional view for explaining a first method of acquiring a signal corresponding to an offset level.

FIG. 12 illustrates a first example of a configuration capable of acquiring the signal corresponding to the offset level. In the configuration exemplified in FIG. 12, an imaging device has a matrix of a plurality of pixels including a dummy pixel 10Dm in addition to the pixel 10Aa described above. In the dummy pixel 10Dm, a light shielding layer 28 covers the permittivity modulation element 20a and blocks the incidence of light on the permittivity modulation element 20a. The basic device structure of the dummy pixel 10Dm is similar to the pixel 10Aa, except for the inclusion of the light shielding layer 28. Note that because the incidence of light on the permittivity modulation element 20a of the dummy pixel 10Dm is unnecessary, as illustrated in FIG. 12, the optical filter 86 and the microlens 88 may be omitted from the dummy pixel 10Dm.

The incident of light on the permittivity modulation element 20a of the dummy pixel 10Dm is prevented by the light shielding layer 28. Consequently, by reading out the output of the detection circuit 40 of the dummy pixel 10Dm in the state with the first voltage applied to the opposite electrode 21e, the signal corresponding to the offset level can be obtained with a relatively simple configuration. Such a dummy pixel 10Dm may be disposed in a peripheral region on the outside of the imaging region in which the pixels 10Aa are arranged. Such a configuration is particularly effective in the case of small inconsistencies in the offset level for each pixel.

Figure 13:
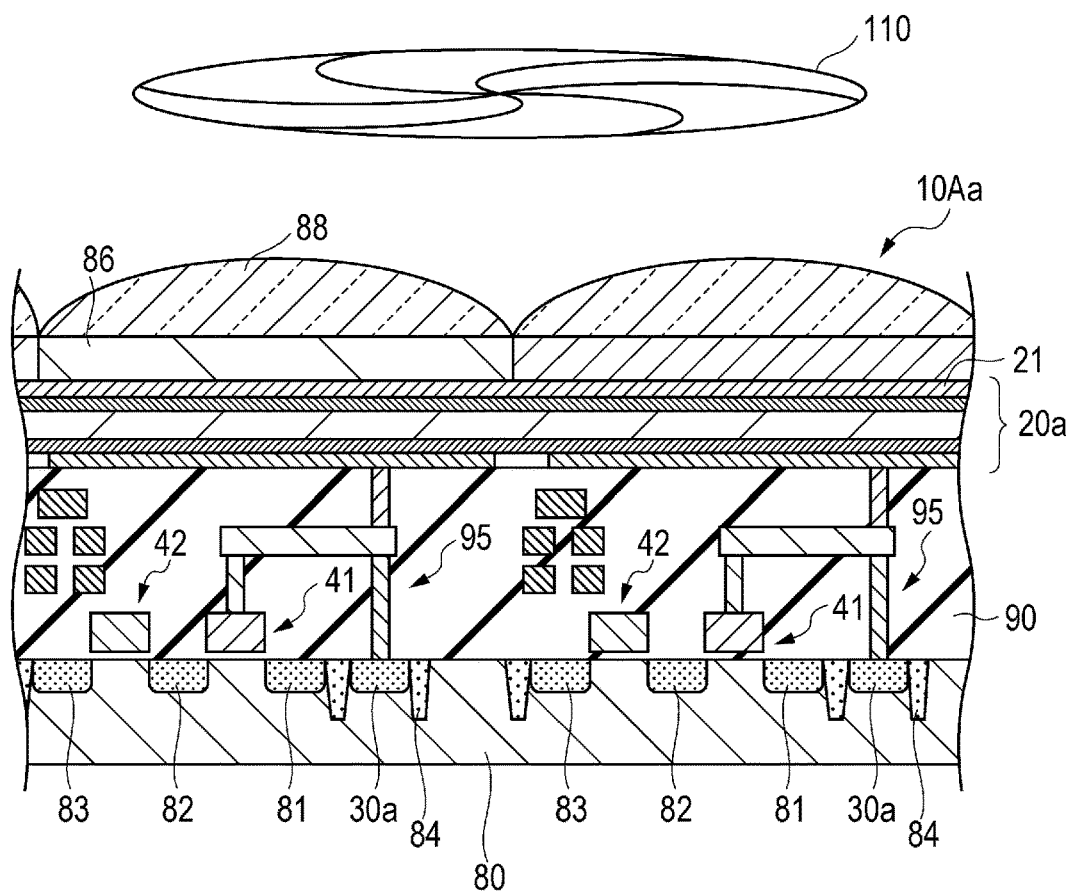
FIG. 13 is a diagram for explaining a second method of acquiring a signal corresponding to an offset level.

FIG. 13 illustrates a second example of a configuration capable of acquiring the signal corresponding to the offset level. In the configuration illustrated in FIG. 13, an imaging device includes a mechanical shutter 110 that switches between allowing the incidence of light on each pixel 10Aa and shielding each pixel 10Aa from light.

If the mechanical shutter 110 is opened in the state with the first voltage applied to the opposite electrode 21e, a pixel signal is obtained through the detection circuit 40. On the other hand, by acquiring the output from the detection circuit 40 in the state with the first voltage applied to the opposite electrode 21e and also with the mechanical shutter 110 closed, the signal corresponding to the offset level can be obtained. In this way, the mechanical shutter 110 that operates in synchronization with the signal processing circuit 60 may be utilized to acquire the signal corresponding to the offset level. According to the second example described here, it is possible to obtain the offset accurately, even if the offset level is different for every pixel.

Figure 14:
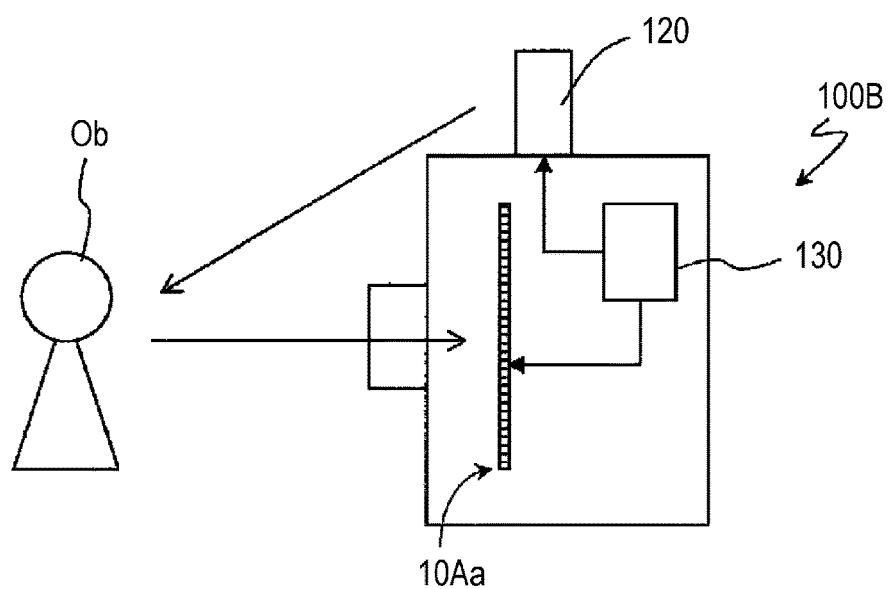
FIG. 14 is a diagram for explaining a third method of acquiring a signal corresponding to an offset level.

FIG. 14 illustrates a third example of a configuration capable of acquiring the signal corresponding to the offset level. An imaging device 100B illustrated in FIG. 14 includes a light source 120 and a control circuit 130 that drives the light source 120 and a plurality of pixels 10Aa in synchronization. The light source 120 irradiates an object Ob with light, such as infrared light for example, in the first period in which the high-level first voltage is applied to the opposite electrode 21e. The plurality of pixels 10Aa outputs signals based on reflected light in a predetermined wavelength band from the object Ob.

With such a configuration, the signal detected by the detection circuit 40 of the pixel 10Aa with the light source 120 in an unlighted state and also with the high-level first voltage applied to the opposite electrode 21e corresponds to the signal corresponding to the offset level. A configuration like the example illustrated in FIG. 14 is also useful in the case of attempting to obtain an image based on light in a specific wavelength band.

A configuration like the example illustrated in FIG. 14 is particularly useful in the case of detecting light in a wavelength band of low intensity contained in ambient light. For example, infrared rays having a wavelength exceeding 900 nm when shooting indoors or approximately 1400 nm when shooting outdoors can be utilized as the light emitted from the light source 120. In the case where the wavelength of the light emitted from the light source 120 is not contained in the spectrum of the ambient light, the signal detected by the detection circuit 40 of each pixel 10Aa with the light source 120 in the unlighted state and also with the high-level first voltage applied to the opposite electrode 21e gives an accurate value of the signal corresponding to the offset level.

All of the first to third examples above are examples of utilizing an output that corresponds to the signal level in the dark state as the signal corresponding to the offset level. Alternatively, it is also possible to obtain the signal corresponding to the offset level without providing a specialized structure for acquiring the signal corresponding to the offset level. For example, the signal output from the detection circuit 40 immediately after switching the voltage that the voltage supply circuit 50 applies to the power line 70 from the low-level second voltage to the high-level first voltage, or in other words, at the very beginning of the first period that corresponds to the exposure period, may be acquired as the signal corresponding to the offset level. In this example, the offset level corresponding to each pixel is likewise acquirable.

In this way, signals corresponding to the offset level for each of the pixels may be read out at once at a timing different from the readout of the pixel signals. Also, the potential of the node M may be computed for each pixel in advance under dark conditions, and a signal corresponding to the potential obtained at this time may be used as the signal corresponding to the offset level. Also, the signal processing circuit 60 may be provided with memory, and offset level values may be stored in the memory in advance. A configuration may also be adopted in which the offset levels in the memory are updated by executing calibration at a freely chosen timing. Note that in the case of small inconsistencies in the offset level for each pixel, a common offset level may also be applied uniformly to all pixels.

Modifications

Figure 15:
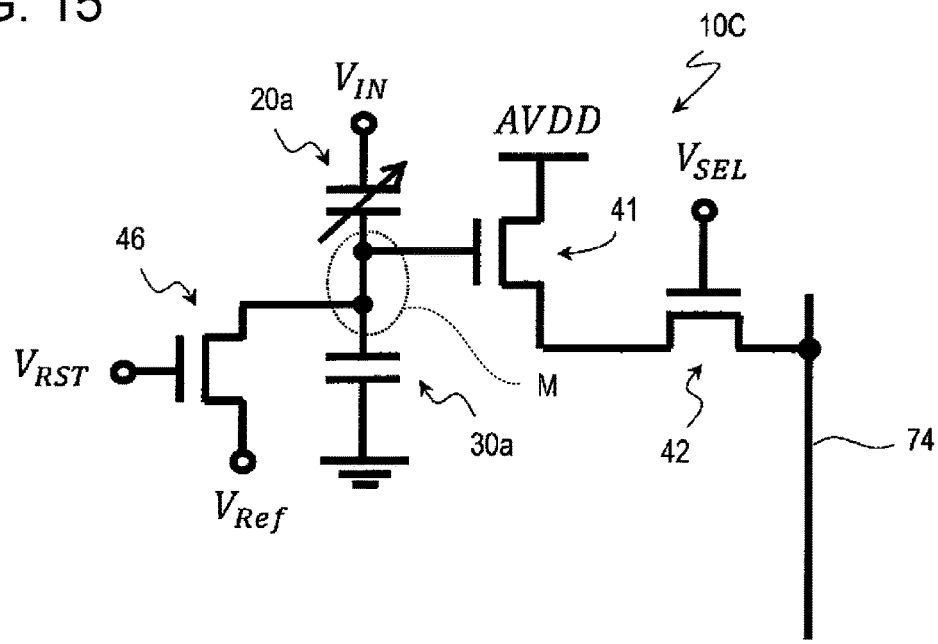
FIG. 15 is a diagram illustrating a modification in which a reset transistor is provided inside a pixel.

FIG. 15 is a diagram illustrating a modification in which a reset transistor is provided inside a pixel. A pixel 10C illustrated as an example in FIG. 15 includes a reset transistor 46 connected to the node M. In the example illustrated in the diagram, one of the source and the drain of the reset transistor 46 is electrically connected to a terminal (for example, the pixel electrode 22e) connected to the node M of the permittivity modulation element 20a. During operation, a predetermined reset voltage $V_{Ref}$ is supplied to the other of the source and the drain of the reset transistor 46. By turning on the reset transistor 46, the potential of the pixel electrode 22e, or in other words the potential of the node M, is reset to $V_{Ref}$. The turning on and off of the reset transistor 46 is controlled by applying a reset signal $V_{RST}$ to the gate of the reset transistor 46 from a row scanning circuit not illustrated, for example.

According to the embodiment of the present disclosure, the charge generated by photoelectric conversion is taken out of the node M and is not stored in the node M. As already described, by setting the voltage $V_{IN}$ applied to the terminal (for example, the opposite electrode 21e) on side opposite the node M of the permittivity modulation element 20a to 0 V for example, it is possible to set the voltage $V_{OUT}$ of the node M, or in other words the input into the detection circuit 40, to 0 V. For this reason, if the voltage that the voltage supply circuit 50 applies to the power line 70 is switched from the high-level first voltage to the low-level second voltage, the exposure of the next frame can be started without applying a reset voltage to the node M. Consequently, by switching the voltage applied to the first terminal 21 by the voltage supply circuit 50 between the first voltage and the second voltage, and having the detection circuit 40 detect the potential of the node M in each of the first period in which the first voltage is supplied to each pixel and the second period in which the second voltage is supplied, light is detectable even in a state in which the permittivity modulation element 20 is continually irradiated with light. In this way, according to a typical embodiment of the present disclosure, a circuit for resetting the node M is basically unnecessary.

However, by providing a reset circuit like the reset transistor 46 inside each pixel, the amount of charge in the node M can be leveled across a plurality of pixels. In other words, the potential of the node M before exposure can be leveled to any value across a plurality of pixels, and inconsistencies in the reference level of every pixel can be cleared up. Consequently, an advantage of being able to use the voltage range effectively is obtained. Also, by using an appropriate reset voltage $V_{Ref}$, the potential of the pixel electrode 22e after the reset can also be made to agree with the potential of the opposite electrode 21e. For example, the reset voltage $V_{Ref}$ may be the same voltage as the second voltage. In the case where the voltage supply circuit 50 applies the second voltage to the opposite electrode 21e in the second period and the reset voltage $V_{Ref}$ is equal to the second voltage, it is possible to make the potential difference imposed on the permittivity modulation structure 26a after the reset operation substantially equal to 0 V. Consequently, it is also possible to set the sensitivity of a particular pixel to zero at any timing.

In the imaging device that includes the pixel 10C, typically, by turning on the reset transistor 46 in the second period in which the second voltage is supplied to the pixel 10C, the reset voltage $V_{Ref}$ is supplied to the pixel electrode 22e, and a reset of the potential of the pixel electrode 22e is executed. The readout of the reference-level signal through the detection circuit 40 is executed after the reset of the potential of the pixel electrode 22e by the reset transistor 46. As described above, it is sufficient to execute the readout of the reference-level signal once in the second period before the first frame period starts or in the second period during the first frame period among a plurality of consecutive frames, for example. By switching the voltage supplied to the pixel 10C to the first voltage, the exposure period of the first frame period starts. If the voltage supplied to the pixel 10C is reverted to the second voltage, the potential of the node M reverts to $V_{Ref}$.

Figure 16:
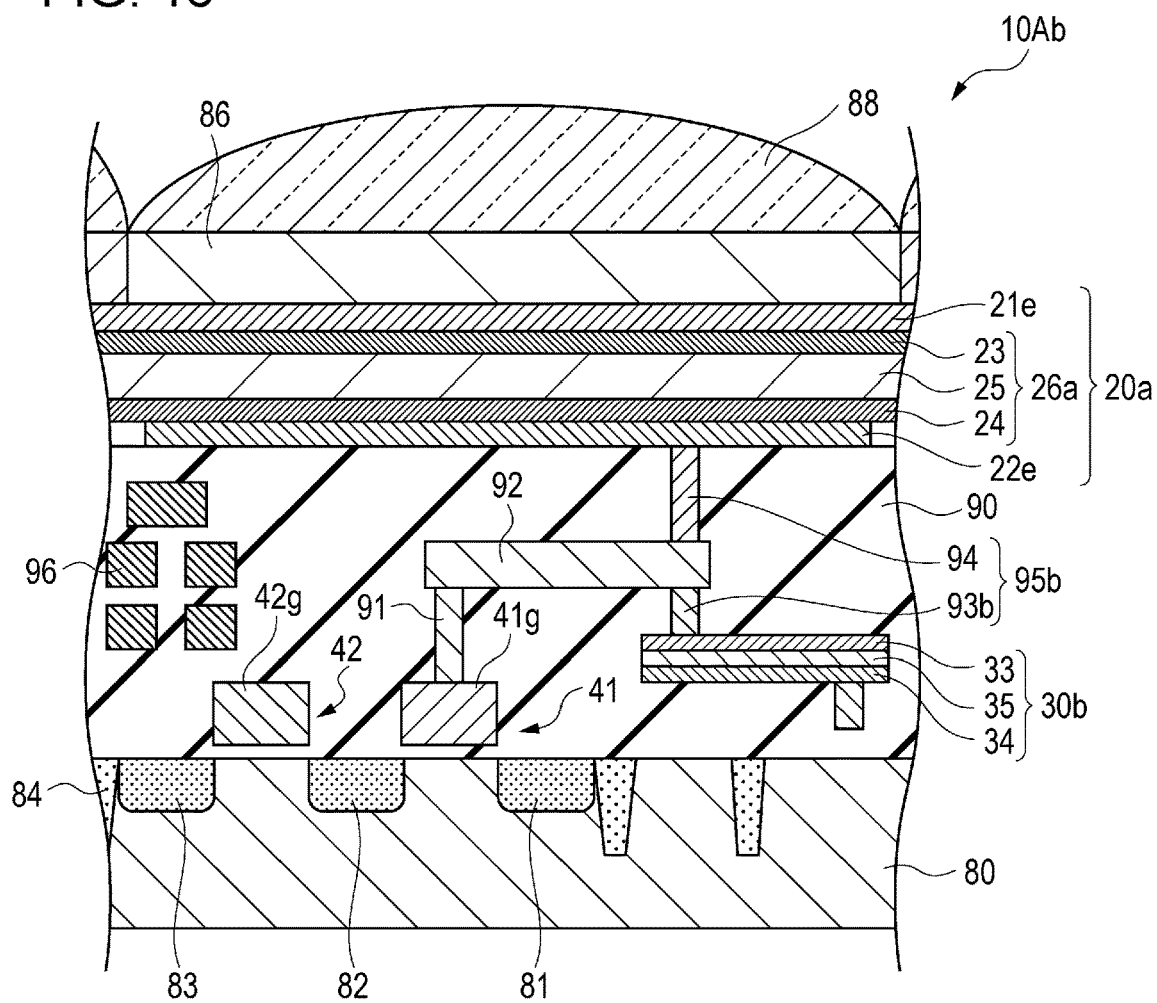
FIG. 16 is a schematic cross-sectional view illustrating another example of the device structure of a pixel.

FIG. 16 illustrates another example of the device structure of a pixel. The difference between the pixel 10Ab illustrated in FIG. 16 and the pixel 10Aa illustrated in FIG. 2 is that the pixel 10Ab includes a capacitive element 30b having a metal-insulator-metal (MIM) structure disposed in the insulating layer 90 instead of the impurity region 30a acting as the capacitive element 30.

In the configuration exemplified in FIG. 16, the capacitive element 30b includes an upper electrode 33, a lower electrode 34 positioned between the upper electrode 33 and the semiconductor substrate 80, and a dielectric layer 35 sandwiched between the upper electrode 33 and the lower electrode 34. A connecting part 95b in the pixel 10Ab includes a plug 93b that electrically connects the upper electrode 33 and the interconnect 92. By connecting an interconnect not illustrated, the potential lower electrode 34 is fixed to ground for example while operating.

In this way, the capacitive element 30 connected to the node M is not limited to the form of a junction capacitance formed by a pn junction, and may also be realized in the form of an MIM structure like the capacitive element 30b, or realized in the form of a MOS capacitor of which one electrode is configured as a semiconductor layer. In the case of applying an MIM structure, part of the interconnect layer 96 may also be utilized as one or both of the upper electrode 33 and the lower electrode 34. For the material of the dielectric layer 35, an oxide such as $SiO_2$, $Al_2O_3$, $HfO_2$, $ZrO_2$, a nitride such as SiN, a compound obtained by combining the above, or an organic material such as PMMA, polyimide, or polystyrene can be broadly used. A substantially singular capacitive element may also be formed by combining different types of materials. Alternatively, part of the insulating layer 90 may be utilized as the dielectric layer 35. In this case, the MIM structure of the capacitive element 30b is also referred to as an MOM structure.

The capacitive element 30b is formed as a structure whose capacitance value changes little or not at all even when light is incident, or a structure in which the change of the capacitance value due to the incidence of light is sufficiently small compared to the change of the capacitance value in the permittivity modulation element 20a. For example, a material such as SiO2 whose relative permittivity changes little or not at all with respect to the incidence of light may be selected as the material of the dielectric layer 35. Alternatively, highly opaque TiN may be applied as the material of the upper electrode 33 and/or the lower electrode 34. The capacitive element 30b may also be disposed inside the insulating layer 90 such that the capacitive element 30b is covered by surrounding opaque material to suppress the incidence of light on the capacitive element 30b.

Whereas the capacitive element 30a described above is typically formed by ion implantation, according to the configuration in which the capacitive element 30 has an MIM structure, the node M does not include an interface between a silicon substrate and a contact plug. Consequently, it is possible to avoid the influence of dark current caused by the interface state. If the reset transistor 46 is formed as a thin-film transistor, the generation of dark current caused by the interface state may also be avoided in the case of a combination with a reset circuit including the reset transistor 46.

The configuration of the permittivity modulation element 20 likewise is not limited to the configuration described with reference to FIG. 2. For example, a layer containing a quantum dot may be applied instead of the photoelectric conversion layer 25 in the permittivity modulation structure 26a illustrated in FIG. 2. A quantum dot produces charge pairs when irradiated by incident light. In this case, similarly to the example illustrated in FIG. 2, an insulating layer or a charge-blocking layer that suppresses the movement of charge is provided in at least one of between the layer containing the quantum dot and the opposite electrode 21e and between the layer containing the quantum dot and the pixel electrode 22e.

Figure 17:
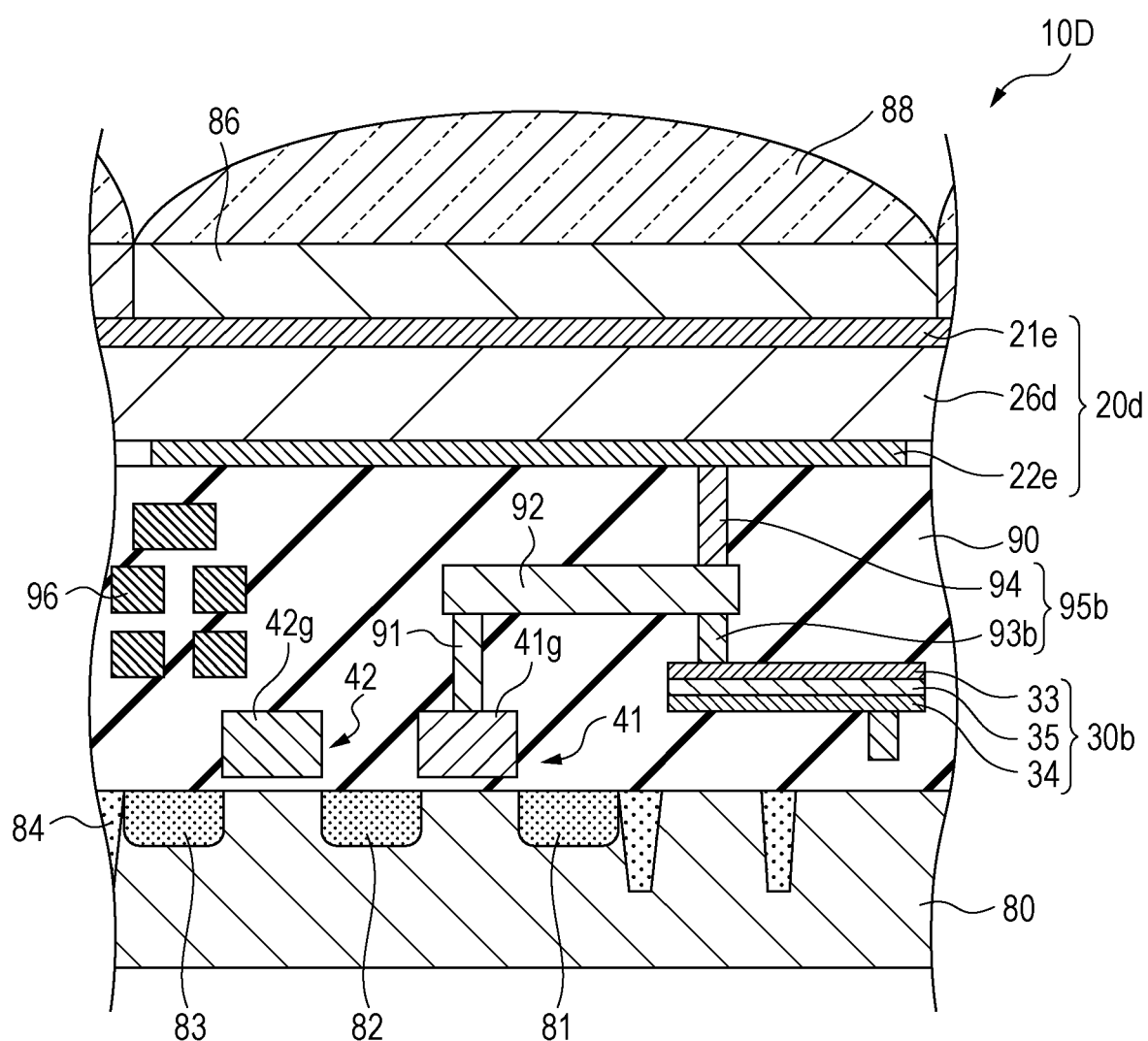
FIG. 17 is a schematic cross-sectional view illustrating another example of a permittivity modulation element.

Note that it is not strictly necessary for the permittivity modulation element 20 to include a structure that generates charge or excitons in response to the incidence of light. FIG. 17 illustrates another example of the permittivity modulation element 20. The pixel 10D illustrated in FIG. 17 has a permittivity modulation element 20d that includes an opposite electrode 21e, a pixel electrode 22e, and a permittivity modulation structure 26d positioned between the opposite electrode 21e and the pixel electrode 22e. In this example, the permittivity modulation structure 26d is a layer containing a material whose permittivity changes due to the radiation of light, such as hafnium oxide. With such a configuration, it is also possible to detect light through a change in the permittivity of the permittivity modulation element 20d due to the radiation of light.

The permittivity response in the permittivity modulation element 20 with respect to the incidence of light may be non-linear or linear with respect to the intensity or duration of the incident light. In any of the above cases, it is possible to detect light. By adopting a permittivity modulation structure that expresses a greater change of permittivity with respect to the radiation of light as the potential difference between the opposite electrode 21e and the pixel electrode 22e becomes larger, the amount of change of the permittivity between when detecting the pixel signal and when detecting the reference-level signal is expanded, and more sensitive detection may be performed. In the case of adopting such a permittivity modulation structure, it is beneficial if the second voltage applied from the voltage supply circuit 50 is a voltage that sets the potential difference between the opposite electrode 21e and the pixel electrode 22e to substantially 0 V, because the difference between the output in the exposure period and the output in the non-exposure period may be expanded.

SECOND EMBODIMENT

Figure 18:
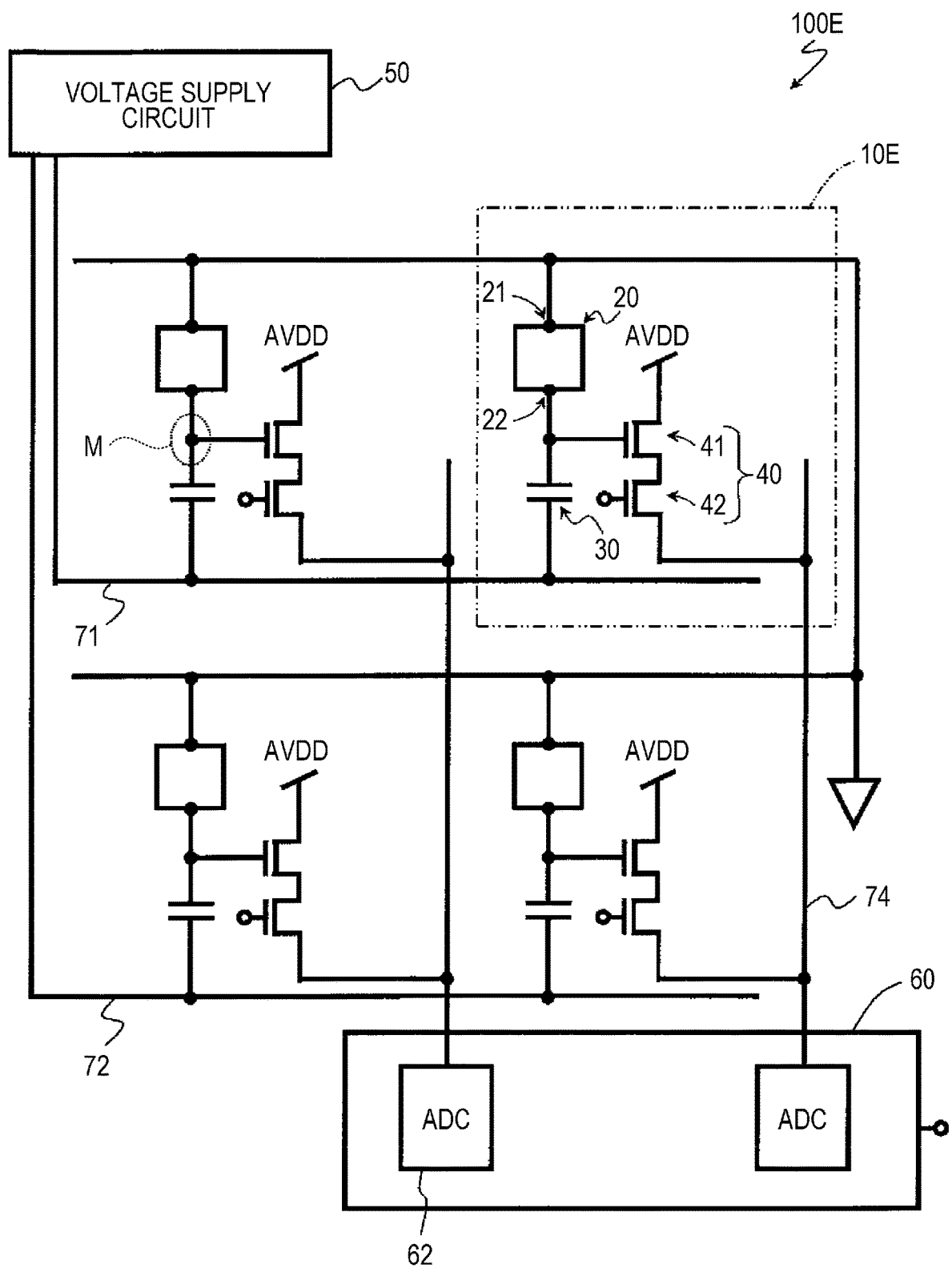
FIG. 18 is a diagram schematically illustrating a configuration of an imaging device according to a second embodiment of the present disclosure.

FIG. 18 is a diagram schematically illustrating a configuration of an imaging device according to a second embodiment of the present disclosure. Compared to the imaging device 100A illustrated in FIG. 1, the imaging device 100E illustrated in FIG. 18 includes a plurality of pixels 10E instead of a plurality of pixels 10A.

As illustrated in FIG. 18, in this example, the electrode not connected to the second terminal 22 of the permittivity modulation element 20 among the electrodes of the capacitive element 30 is electrically connected to the voltage supply circuit 50 through power lines 71 and 72. In other words, in this example, the voltage supply circuit 50 is capable of switching between the first voltage and the second voltage to supply to the second terminal 22 of the permittivity modulation element 20 through the capacitive element 30. On the other hand, the potential of the first terminal 21 is fixed to a common ground for example while operating.

Provided that $V_{IN}$ is the voltage applied from the voltage supply circuit 50 on the second terminal 22 side of the permittivity modulation element 20 through the capacitive element 30, the voltage $V_{OUT}$ of the node M in such a circuit configuration is expressed by the following Formula (4) instead of Formula (1) described above.

$$V_{OUT} = \frac{C_{ref}}{C_{PC} + C_{ref}} V_{IN} \quad (4)$$

As Formula (4) demonstrates, in the circuit configuration exemplified in FIG. 18, if the capacitance value $C_{PC}$ increases due to the radiation of light, the voltage $V_{OUT}$ exhibits a decreasing change. In both the configuration in which the voltage supply circuit 50 changes the potential on the first terminal 21 side and the configuration in which the voltage supply circuit 50 changes the potential on the second terminal 22 side, because the input voltage into the signal detection transistor 41 that acts as a source follower changes due to the radiation of light, the detection circuit 40 is capable of detecting the permittivity change in the permittivity modulation element 20 as a voltage change.

The first embodiment is configured such that the potential on the first terminal 21 side is changed by the voltage supply circuit 50 while treating the potential on the second terminal 22 side of the permittivity modulation element 20 as a reference, but like this example, a configuration is also possible in which the potential on the first terminal 21 side of the permittivity modulation element 20 is treated as a reference and the potential of the electrode on the side not connected to the second terminal 22 among the electrodes of the capacitive element 30 is changed. It is sufficient for the voltage supply circuit 50 to be capable of treating one of the first terminal 21 and the second terminal 22 of the permittivity modulation element 20 as a reference, and applying a predetermined voltage to the other terminal. By having the voltage supply circuit 50 supply a voltage to the first terminal 21 side or the electrode on the side not connected to the second terminal 22 among the electrodes of the capacitive element 30, the potential difference between the first terminal 21 and the second terminal 22 can be uniquely determined. Consequently, for example, the potential difference applied to the permittivity modulation structure 26a or 26d is also uniquely determined. In the circuit configuration exemplified in FIG. 18, the capacitive element 30 is interposed between the second terminal 22 and the voltage supply circuit 50 of each pixel 10E, but it can be said that the potential difference between the first terminal 21 and the second terminal 22 is substantially controlled by the voltage that the voltage supply circuit 50 supplies.

Herein, among the four pixels 10E illustrated in FIG. 18, the power line 71 is connected to the capacitive elements 30 of the two pixels 10E belonging to the first row, while the power line 72 is connected to the capacitive elements 30 of the two pixels 10E belonging to the second row. Consequently, according to such connections, the potentials of the nodes M are individually controllable in units of rows.

Figure 19:
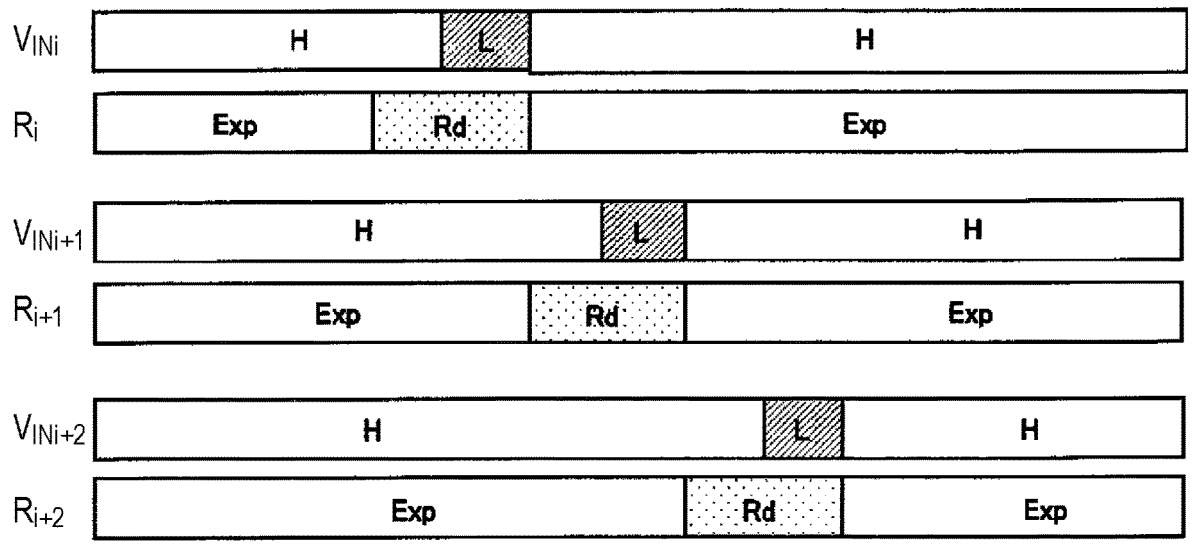
FIG. 19 is a diagram for explaining one example of readout operations in the imaging device illustrated in FIG. 18.

FIG. 19 schematically illustrates one example of readout operations in the imaging device 100E illustrated in FIG. 18. In FIG. 19, the relationship between the change of the voltage $V_{IN}$ applied to the second terminal 22 side and the exposure period and the readout period is illustrated for each of a pixel belonging to an ith row, a pixel belonging to an (i+1)th row, and a pixel belonging to an (i+2)th row from among a plurality of rows. Like the example illustrated in FIG. 7, the shaded rectangles Rd represent periods in which the readout of the pixel signal and the readout of the reference-level signal are executed. In the same way as the example described with reference to FIG. 7, the readout of the pixel signal is executed in the first period, and the readout of the reference-level signal is executed in the second period.

As exemplified in FIG. 18, according to a configuration in which the potential on the second terminal 22 side is changed through the capacitive element 30, it is possible to execute the switching between the first voltage and the second voltage at arbitrarily decided timings, such as for every row for example. For this reason, as illustrated in FIG. 19, the switching between the first voltage and the second voltage as well as the signal readout periods can be shifted every row and readout operations similar to what is referred to as a rolling shutter can be applied. In this way, by executing the switching between the first voltage and the second voltage every row for example, it is possible to eliminate the periods that do not contribute to a change in permittivity and in which signal readout is not performed, which are illustrated by the dark shaded rectangles in FIGS. 7 and 8. Consequently, for example, imaging with an extended exposure period and a further improved SN ratio is possible. Note that in a configuration that connects the power line 70 to the opposite electrode 21e, such switching of the voltage in units of rows may also be achieved by patterning the opposite electrode 21e to be isolated in each row of the plurality of pixels. However, in this case, it is necessary to consider the delay due to the interconnect resistance of the opposite electrode 21e, and the configuration exemplified in FIG. 18 is more favorable for speeding up operations.

Herein, an example is described in which the power lines 71 and 72 are provided independently to each row of the plurality of pixels 10E and the switching between the first voltage and the second voltage is executed independently in units of rows. However, the configuration is not limited to this example, and power lines connected to the voltage supply circuit 50 may also be connected independently to each column of the plurality of pixels 10E or to each pixel 10E. In other words, the voltage supply circuit 50 may also be configured to supply different voltages independently in units of columns or units of pixels, and individually control the potentials of the nodes M in units of columns or units of pixels.

THIRD EMBODIMENT

Figure 20:
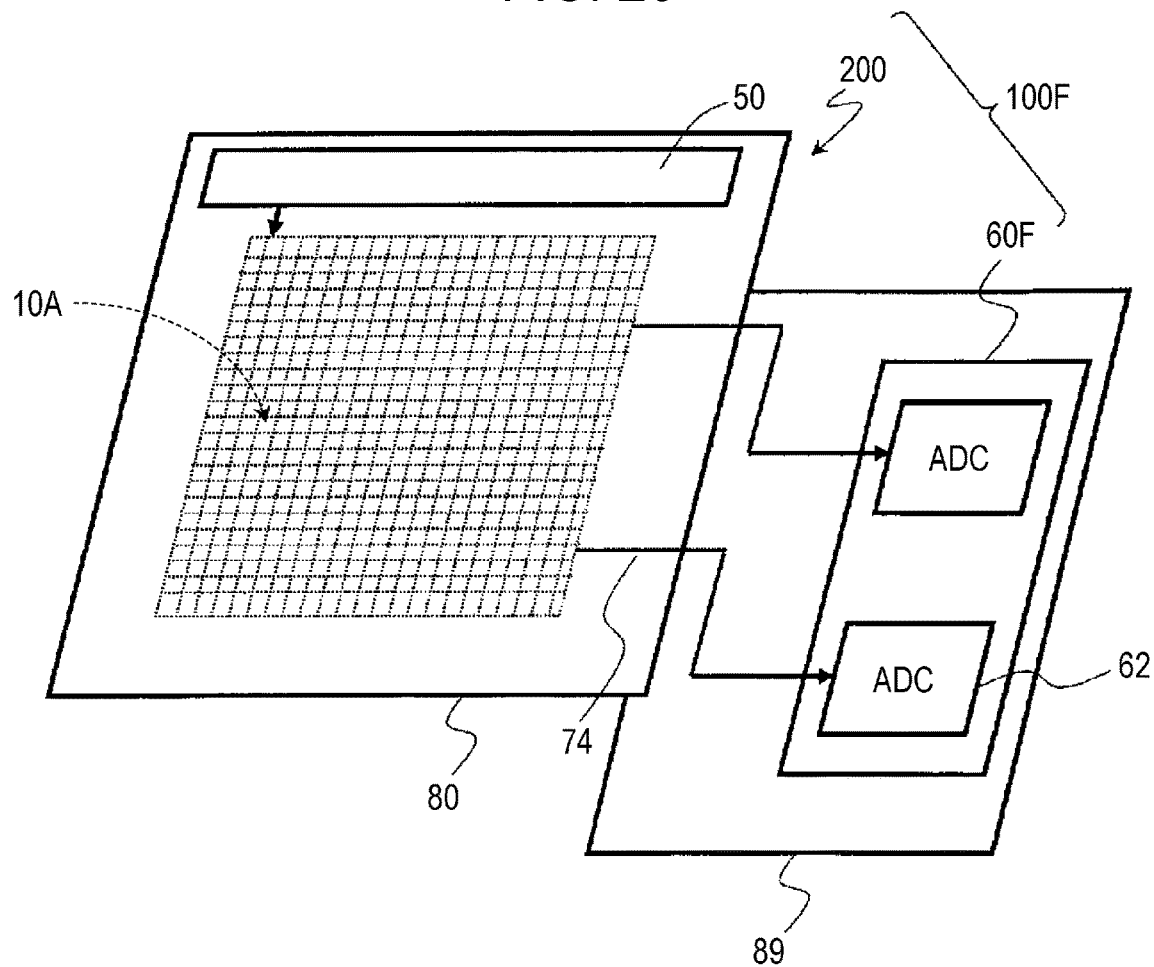
FIG. 20 is a diagram illustrating an overview of an exemplary configuration of an imaging device according to a third embodiment of the present disclosure.

FIG. 20 illustrates an overview of an exemplary configuration of an imaging device according to a third embodiment of the present disclosure. An imaging device 100F illustrated in FIG. 20 includes an image sensor 200 and a signal processing circuit 60F that processes electrical signals from the image sensor 200.

As schematically illustrated in FIG. 20, like the imaging device 100A described above, the image sensor 200 includes a plurality of pixels 10A for example, converts incident light into electrical signals, and outputs the electrical signals to the signal processing circuit 60F. Any of the pixels 10B, 10C, 10D, and 10E described above are also applicable instead of the pixels 10A. In the configuration exemplified in FIG. 20, the image sensor 200 additionally includes a voltage supply circuit 50 that supplies a predetermined voltage to each of the pixels 10A. Like each of the examples described above, the voltage supply circuit 50 likewise is capable of switching between a first voltage and a second voltage to supply to each of the pixels 10A, and also supplies the first voltage to each pixel 10A in a first period while supplying the second voltage in a second period different from the first period.

Like the signal processing circuit 60 in each of the examples described above, the signal processing circuit 60F generates and outputs the difference between a pixel signal obtained in the period while the high-level first voltage is being supplied to a power line connected to the voltage supply circuit 50 and a reference-level signal obtained in the period while the low-level second voltage is being supplied to the power line. Note that typically, the signal processing circuit 60F is provided with a number of AD conversion circuits 62 equal to the number of columns of the plurality of pixels 10A. In FIG. 20, for simplicity, two such AD conversion circuits 62 are illustrated as a representative example.

In the image sensor 200, the plurality of pixels 10A are formed on a semiconductor substrate 80 and the voltage supply circuit 50 is also provided on the semiconductor substrate 80, but in this example, the signal processing circuit 60F is provided on a circuit substrate 89 different from the semiconductor substrate 80. Like this example, some circuits including the AD conversion circuits 62 may also be formed on a substrate different from the substrate on which the pixels are disposed. For example, a single camera system may be constructed by stacking and electrically connecting these two substrates to each other.

As described above, in the embodiment of the present disclosure, the voltage supply circuit 50 treats one of the first terminal 21 and the second terminal 22 of the permittivity modulation element 20 as a reference, and selectively applies either the first voltage or the second voltage to the other terminal. For example, the voltage supply circuit 50 supplies the high-level first voltage to each pixel in an exposure period and supplies the low-level second voltage to each pixel in a reference level readout period. Also, the detection circuit 40 executes the readout of a pixel signal at a level corresponding to the light intensity in the first period during which the voltage supply circuit 50 supplies the first voltage, and executes the readout of a reference-level signal in the second period during which the voltage supply circuit 50 supplies the second voltage. With this arrangement, it is possible to detect light through a change in the permittivity of the permittivity modulation element 20 while also securing the SN ratio. Note that the first voltage and/or the second voltage may also be applied as a pulse, and the application may also be repeated periodically or quasi-periodically.

EXAMPLES

Example 1

Figure 21:
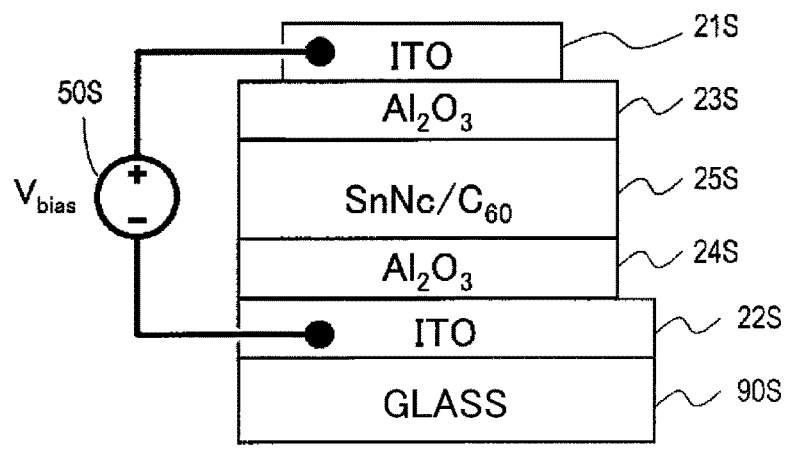
FIG. 21 is a diagram schematically illustrating a structure of a sample fabricated as Example 1.

A sample resembling the permittivity modulation element 20 described above was fabricated, and by measuring the capacitance value while varying the bias, the change in the permittivity with respect to light intensity in the fabricated sample was evaluated. FIG. 21 is a diagram schematically illustrating a structure of the sample fabricated as Example 1. The sample was fabricated as follows.

First, a glass substrate 90S was prepared. Next, ITO and $Al_2O_3$ were successively deposited on top of the glass substrate by sputtering and atomic layer deposition (ALD), respectively, thereby forming a bottom electrode 22S and an insulating layer 24S on top of the glass substrate. Next, Suzuna phthalocyanine (SnNc) and fullerene ($C_{60}$) were successively deposited by vapor deposition to form a photoelectric conversion layer 25S. At this point, both the Suzuna phthalocyanine layer and the fullerene layer had a thickness of approximately 75 nm.

After forming the photoelectric conversion layer 25S, additional $Al_2O_3$ and ITO were successively deposited on top of the photoelectric conversion layer 25S by ALD and sputtering to form a laminate structure of an insulating layer 23S and a top electrode 21S. According to the above procedure, the sample of Example 1 was obtained. At this point, the thickness of the insulating layers 24S and 23S was approximately 20 nm, the thickness of the photoelectric conversion layer 25S was approximately 150 nm, and the thickness of the top electrode 21S was approximately 50 nm.

Next, a bias $V_{bias}$ applied between the bottom electrode 22S and the top electrode 21S was varied while irradiating the sample from the top electrode 21S side with light having a wavelength of 940 nm to measure the current response with respect to an alternating-current (AC) voltage, thereby measuring the capacitance value between the bottom electrode 22S and the top electrode 21S. The measurement was performed using a Hewlett-Packard Precision LCR Meter 4284A, and the capacitance value was measured in sequential mode with the AC voltage amplitude set to 100 mV and the measurement frequency set to 100 Hz.

Figure 22:
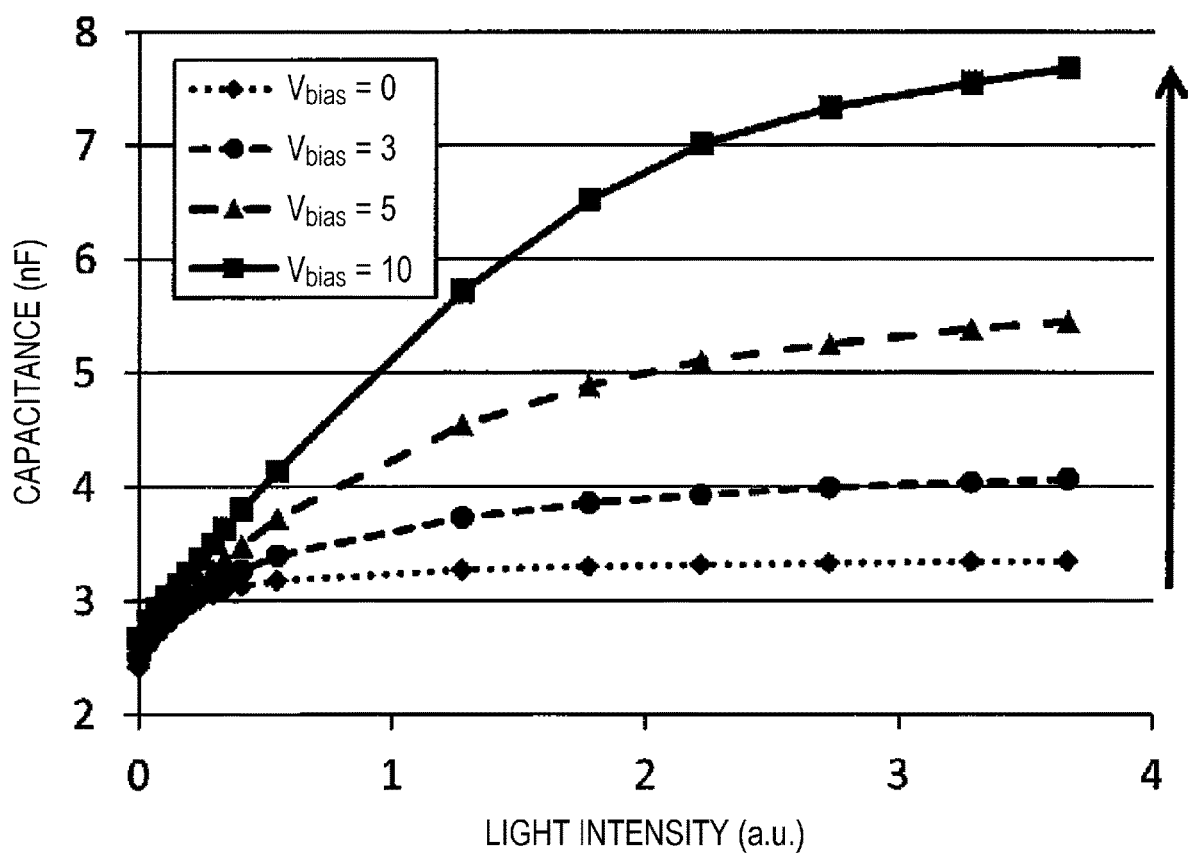
FIG. 22 is a graph illustrating the results of measuring a change in the capacitance values as the light intensity is varied at different biases in relation to the sample of Example 1.

FIG. 22 illustrates the results of measuring the change in the capacitance values as the light intensity is varied at different biases in relation to the sample of Example 1. The horizontal axis of the graph illustrated in FIG. 22 indicates the light intensity irradiating the sample, while the vertical axis indicates the capacitance value between the bottom electrode 22S and the top electrode 21S. Note that the units of light intensity illustrated in FIG. 22 are arbitrary units.

Herein, the change in the capacitance value with respect to the light intensity was measured respectively with the bias $V_{bias}$ set to 0 V, 3 V, 5 V, and 10 V. As FIG. 22 demonstrates, when the bias $V_{bias}$ is 0 V, the capacitance value exhibits little or no change even if light is radiated, but when the bias $V_{bias}$ is 3 V, 5 V, and 10 V, the capacitance value increases as the light intensity increases. FIG. 22 also demonstrates that the change in the permittivity with respect to the change in the light intensity increases as the potential difference applied to the laminate structure of the insulating layer 24S, the photoelectric conversion layer 25S, and the insulating layer 23S expands. In this way, by adopting a structure in which a photoelectric conversion layer is sandwiched between insulating layers for example as the permittivity modulation structure, a change in light intensity is detectable through a change in permittivity.

The imaging device of the present disclosure is applicable to an image sensor and the like, and is particularly useful in an image sensor for detecting light in the infrared range that is susceptible to the influence of dark current. The imaging device of the present disclosure can be used in devices such as digital cameras, medical cameras, and machine vision cameras (for example, robot cameras). A machine vision camera may be utilized as an input for performing image recognition to determine the state of, categorize, or detect defects in produce in a production plant, for example. An embodiment of the present disclosure is also useful in devices such as security cameras and cameras installed in a vehicle. An in-vehicle camera may be utilized as an input for a control device for the vehicle to run safely, for example. Alternatively, an in-vehicle camera may be utilized to assist an operator in driving the vehicle safely. An infrared image is usable for sensing such as distance detection and object recognition, for example.

What is claimed is:
1. An imaging device comprising:
one or more pixels, each of the one or more pixels including
a permittivity modulation element that includes an opposite electrode, a pixel electrode, and a permittivity modulation structure between the opposite electrode and the pixel electrode, a permittivity of the permittivity modulation structure being configured to change according to a radiation of light,
a capacitive element that includes a first electrode and a second electrode, the second electrode being electrically connected to the pixel electrode, and a detection circuit that outputs a signal corresponding to a potential of the pixel electrode;

a voltage supply circuit that applies a first voltage in a first period and a second voltage in a second period different from the first period to one of the opposite electrode and the first electrode; and a signal processing circuit that generates a third signal, the third signal being a difference between a first signal output from the detection circuit in the first period and a second signal output from the detection circuit in the second period, wherein a potential difference between the opposite electrode and the first electrode when the second voltage is applied to the one of the opposite electrode and the first electrode is less than a potential difference between the opposite electrode and the first electrode when the first voltage is applied to the one of the opposite electrode and the first electrode.

2. The imaging device according to claim 1, wherein the signal processing circuit outputs a fifth signal obtained by subtracting a fourth signal corresponding to an offset level from the third signal.

3. The imaging device according to claim 2, wherein the fourth signal is a signal output from the detection circuit in a state in which the first voltage is applied to the one of the opposite electrode and the first electrode, and the permittivity modulation structure is not irradiated with light.

4. The imaging device according to claim 3, wherein
the one or more pixels are a plurality of pixels,
the plurality of pixels includes a dummy pixel further including a light shielding layer that covers the permittivity modulation structure, and
the fourth signal is a signal output from the detection circuit of the dummy pixel in a state in which the first voltage is applied to the one of the opposite electrode and the first electrode.

5. The imaging device according to claim 3, further comprising:
a mechanical shutter that switches between being open to allow light to be incident on the permittivity modulation structure and being closed to shield the permittivity modulation structure from light, wherein
the first signal is a signal output from the detection circuit in a state in which the mechanical shutter is open, and
the fourth signal is a signal output from the detection circuit in a state in which the first voltage is applied to the one of the opposite electrode and the first electrode, and the mechanical shutter is closed.

6. The imaging device according to claim 2, wherein the fourth signal is a signal output from the detection circuit immediately after the voltage applied to the one of the opposite electrode and the first electrode is switched from the second voltage to the first voltage.

7. The imaging device according to claim 2, further comprising:
a light source, wherein
the light source radiates light of a predetermined wavelength band on an object in the first period, and
the fourth signal is a signal output from the detection circuit in a state in which the first voltage is applied to the one of the opposite electrode and the first electrode, and the light source is in an unlighted state.

8. The imaging device according to claim 1, wherein in two or more consecutive frame periods, a number of times that the second signal is read out by the detection circuit is less than a number of times that the first signal is read out by the detection circuit.

9. The imaging device according to claim 1, wherein
the permittivity modulation structure includes
a photoelectric conversion layer, and
a charge-blocking layer located between either the pixel electrode or the opposite electrode and the photoelectric conversion layer.

10. The imaging device according to claim 9, wherein the photoelectric conversion layer contains an organic material.

11. The imaging device according to claim 1, wherein
the permittivity modulation structure includes
a layer containing a quantum dot that produces charge pairs in response to a radiation of light, and
a charge-blocking layer located between either the pixel electrode or the opposite electrode and the layer containing the quantum dot.

12. The imaging device according to claim 1, wherein the permittivity modulation structure includes a layer containing a material whose permittivity changes due to a radiation of light.

13. The imaging device according to claim 9, wherein
the permittivity modulation structure includes
a first charge-blocking layer located between the opposite electrode and the photoelectric conversion layer, and
a second charge-blocking layer located between the pixel electrode and the photoelectric conversion layer.

14. The imaging device according to claim 11, wherein
the permittivity modulation structure includes
a first charge-blocking layer located between the opposite electrode and the layer containing the quantum dot, and
a second charge-blocking layer located between the pixel electrode and the layer containing the quantum dot.

15. The imaging device according to claim 13, wherein the first charge-blocking layer and the second charge-blocking layer are insulating layers.

16. The imaging device according to claim 9, wherein
each of the one or more pixels includes a reset transistor, one of a source and a drain of the reset transistor being electrically connected to the pixel electrode, and
the reset transistor supplies a reset voltage that resets the potential of the pixel electrode to the pixel electrode in the second period.

17. The imaging device according to claim 16, wherein the detection circuit reads out the second signal after the reset transistor resets the potential of the pixel electrode.

18. The imaging device according to claim 16, wherein
the voltage supply circuit applies the second voltage to the opposite electrode of the permittivity modulation element in the second period, and
the reset voltage is equal to the second voltage.

19. The imaging device according to claim 1, further comprising:
a first substrate supporting the permittivity modulation element, the detection circuit of each of the one or more pixels being located on the first substrate; and
a second substrate different from the first substrate, the signal processing circuit being located on the second substrate.

20. The imaging device according to claim 1, wherein the first period and the second period are included in a same single frame period.

* * * * *